(12) United States Patent
Ozawa

(10) Patent No.: US 7,199,042 B2
(45) Date of Patent: Apr. 3, 2007

(54) SEMICONDUCTOR DEVICE WITH MULTI-LAYERED WIRING ARRANGEMENT INCLUDING REINFORCING PATTERNS, AND PRODUCTION METHOD FOR MANUFACTURING SUCH SEMICONDUCTOR DEVICE

(75) Inventor: Ken Ozawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/981,679

(22) Filed: Nov. 5, 2004

(65) Prior Publication Data

US 2005/0101117 A1    May 12, 2005

(30) Foreign Application Priority Data

Nov. 6, 2003   (JP) .............................. 2003-377040

(51) Int. Cl.
H01L 21/4763   (2006.01)
(52) U.S. Cl. ........................................ 438/624; 438/14
(58) Field of Classification Search .................. 438/14, 438/624, 636, 637, 638, 675, 687
See application file for complete search history.

(56) References Cited

U.S. PATENT DOCUMENTS

| | | | |
|---|---|---|---|
| 6,100,589 A | 8/2000 | Tanaka | |
| 6,198,170 B1 | 3/2001 | Zhao | |
| 6,222,269 B1* | 4/2001 | Usami | 257/758 |
| 6,297,563 B1 | 10/2001 | Yamaha | |
| 6,492,735 B1 | 12/2002 | Matsubara | |
| 6,576,550 B1* | 6/2003 | Brase et al. | 438/687 |
| 6,943,431 B2* | 9/2005 | Fukuyama et al. | 257/637 |
| 2002/0017672 A1 | 2/2002 | Ker, et al. | |
| 2002/0179991 A1 | 12/2002 | Varrot, et al. | |
| 2004/0183162 A1* | 9/2004 | Ohto et al. | 257/365 |

FOREIGN PATENT DOCUMENTS

| | | |
|---|---|---|
| JP | 2001-168093 A | 6/2001 |
| JP | 2003-031611 A | 1/2003 |

* cited by examiner

Primary Examiner—Phuc T. Dang
(74) Attorney, Agent, or Firm—Sughrue Mion, PLLC

(57) ABSTRACT

A semiconductor device includes a semiconductor substrate having electronic elements produced therein, and an insulating underlayer formed thereon, and a multi-layered wiring arrangement constructed on the insulating underlayer semiconductor substrate. The multi-layered wiring arrangement includes a first insulating interlayer structure formed on the insulating underlayer, a second insulating interlayer structure, and a third insulating interlayer structure formed on the first insulating interlayer structure. Each of the first, second and third insulating interlayer structures includes a low-k insulating layer, and has a reinforcing element formed therein. The second insulating interlayer structure has a joint plug formed therein. The reinforcing elements of the first and third insulating interlayer structures are connected to each other through the joint plug.

17 Claims, 21 Drawing Sheets

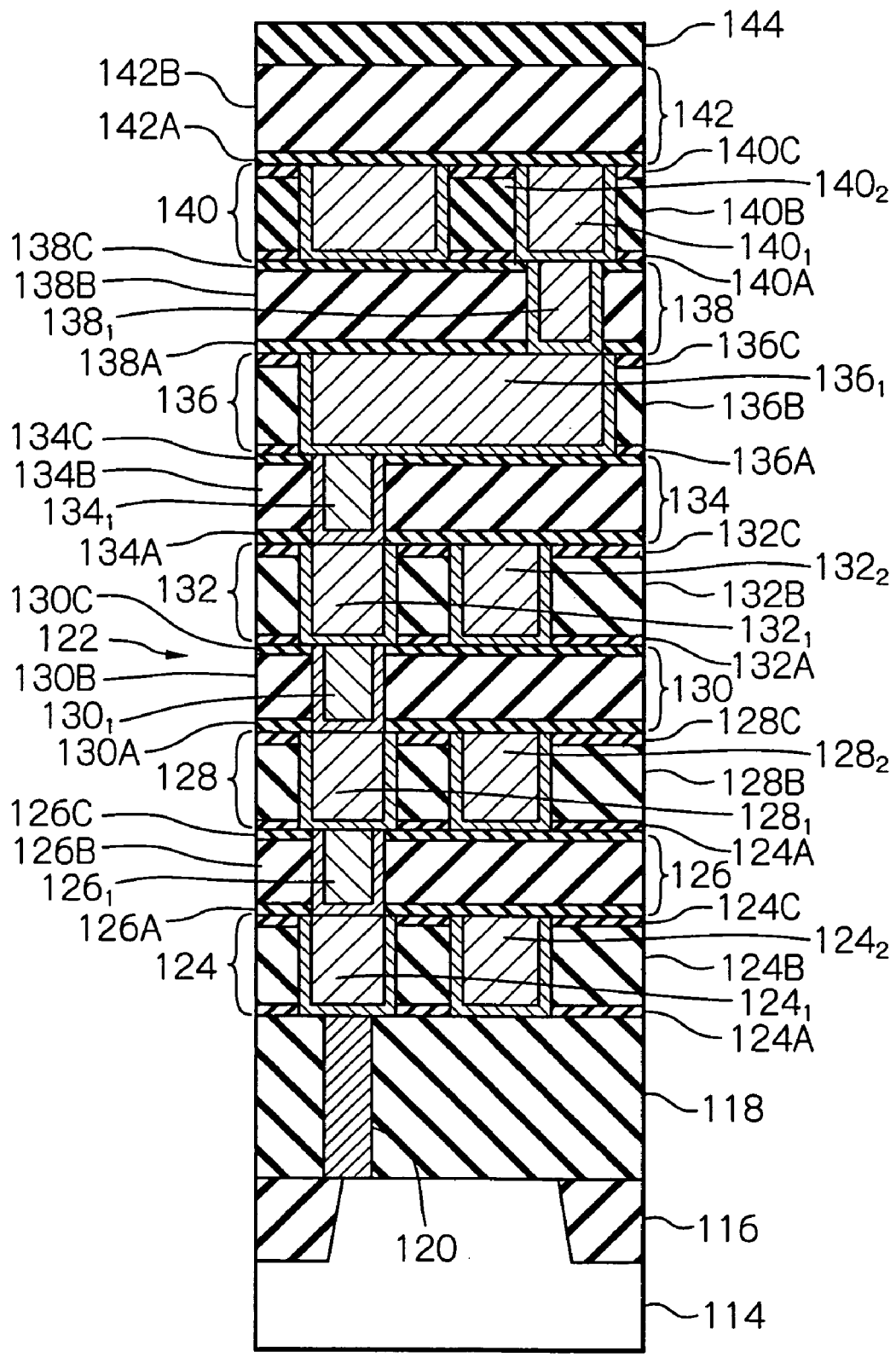

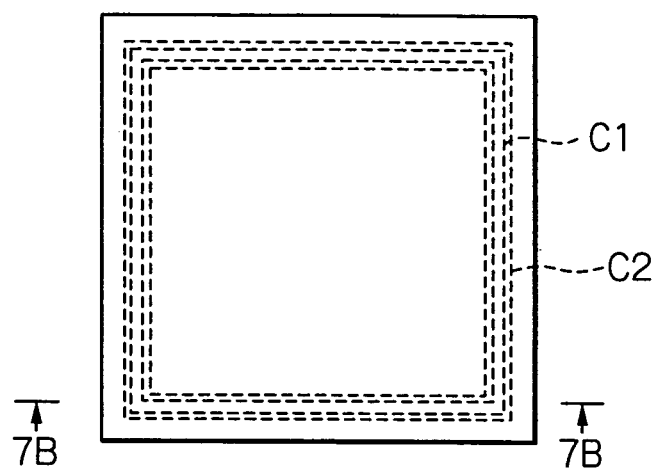
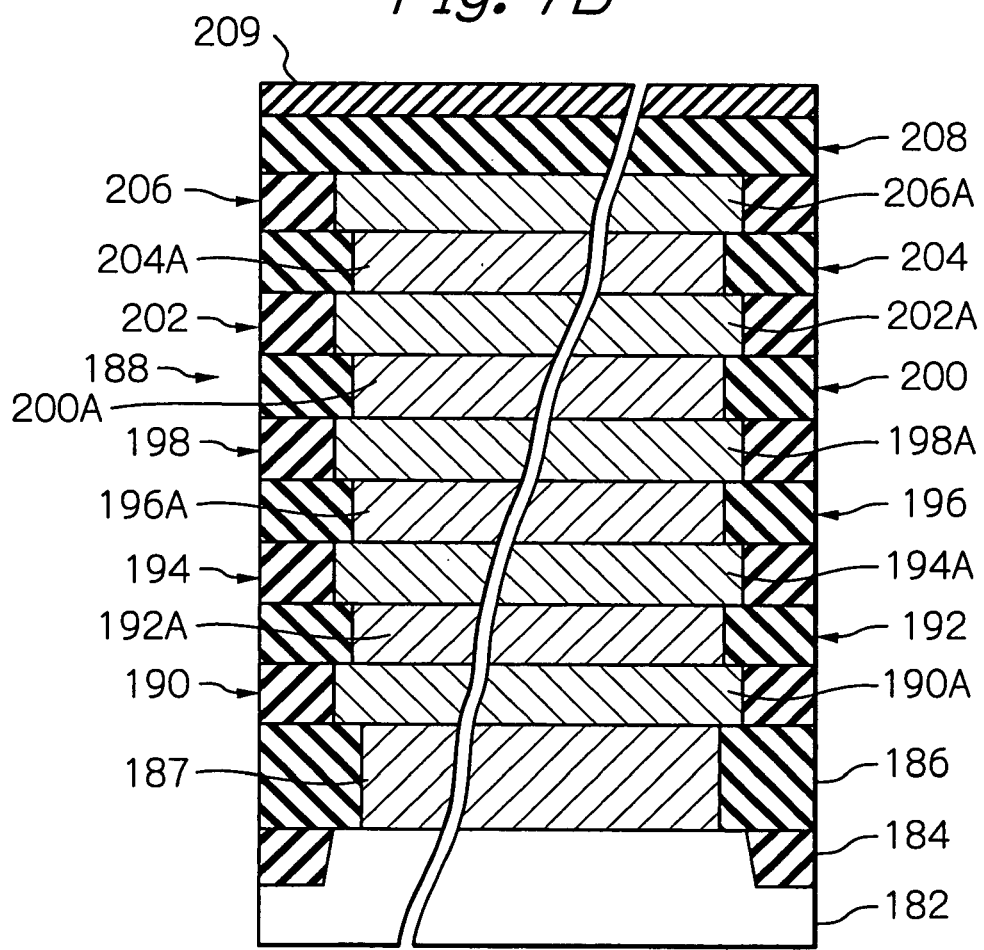

SEMICONDUCTOR DEVICE WITH MULTI-LAYERED WIRING ARRANGEMENT INCLUDING REINFORCING PATTERNS, AND PRODUCTION METHOD FOR MANUFACTURING SUCH SEMICONDUCTOR DEVICE

BACKGROUND OF THE INVENTION

1. Field of the Invention

The present invention relates to a semiconductor device with a multi-layered wiring arrangement including reinforcing metal patterns formed therein, and a production method for manufacturing such a semiconductor device.

2. Description of the Related Art

In a representative process of producing a plurality of semiconductor devices, for example, a silicon wafer is prepared, and a surface of the silicon wafer is sectioned into a plurality of semiconductor chip areas by forming grid-like fine grooves (i.e. scribe lines) in the silicon wafer. Then, the silicon wafer is processed by various well-known methods such that various elements, such transistors, resistors, capacitors and so on, are produced in each of the semiconductor chip areas on the silicon wafer, and an insulating layer, such as a silicon dioxide layer, is formed as an underlayer on the silicon wafer. Also, a plurality of contact plugs, made of a suitable metal material, are formed in an area of the insulating underlayer, which corresponds to each of the semiconductor chip areas, and each of the contact plugs is electrically connected to an element produced in the corresponding semiconductor chip areas.

Subsequently, a multi-layered wiring arrangement is constructed on the insulating underlayer of the silicon wafer, using various processes, for example, a chemical vapor deposition (CVD) process, a photolithography process, an etching process, a sputtering process, an electroplating process, and so on.

The multi-layered wiring arrangement includes at least three insulating interlayer structures: a lowermost insulating interlayer structure formed on the insulating underlayer of the silicon wafer and having respective metal wiring layout patterns formed thereon for the semiconductor chip areas on the silicon wafer; at least one intermediate insulating interlayer structure formed on the lowermost interlayer structure and having respective metal wiring layout patterns formed thereon for the semiconductor chip areas on the silicon wafer; and an uppermost insulating interlayer structure formed on the intermediate insulating interlayer structure and having respective plural sets of electrode pads formed thereon for the semiconductor chip areas on the silicon wafer. Further, the multi-layered wiring arrangement includes a passivation layer as a protective layer, which is formed on the uppermost insulating interlayer structure, and which is perforated such that the electrode pads are exposed to the outside.

Each of the metal wiring layout patterns included in the lowermost insulating interlayer structure is suitably and electrically connected to the contact plugs provided for a corresponding semiconductor chip area through the intermediary of via plugs formed in the lowermost insulating interlayer structure. Also, each of the metal wiring layout patterns included in the intermediate insulating interlayer structure is suitably and electrically connected to a corresponding metal wiring layout pattern, included in the lowermost insulating layer structure, through the intermediary of via plugs formed in the intermediate interlayer structure. Further, each set of electrode pads included in the uppermost insulating interlayer structure are suitably and electrically connected to a corresponding set of metal wiring layout patterns included in the insulating interlayer structure, through the intermediary of via plugs formed in the uppermost insulating interlayer structure.

After the construction of the multi-layered wiring arrangement, the silicon wafer is subjected to a dicing process, in which the silicon wafer is cut along the grid-like grooves, whereby the semiconductor chip areas are separated from each other as semiconductor devices (bare chips).

Each of the aforesaid insulating interlayer structures is frequently constituted by some insulating layers, which are respectively made of different insulating materials. For example, as shown in JP-A-2001-168093, the insulating interlayer structure is constituted by a silicon nitride (SiN) layer, a spin-on-glass (SOG) layer formed thereon, and a silicon dioxide ($SiO_2$) layer formed thereon. Since the SOG layer exhibits an inferior adhesion property with respect to both the SiN layer and the $SiO_2$ layer, the SiN layer and the $SiO_2$ layer are liable to be peeled from the SOG layer when being repeatedly subjected to thermal stresses.

Therefore, in JP-A-2001-168093, it has been proposed that reinforcing metal patterns, called dummy wiring patterns, are incorporated in the multi-layered wiring arrangement. In particular, two sets of reinforcing patterns are formed on two adjacent insulating interlayer structures of the multi-layered wiring arrangement, and are connected to each other through the intermediary of via plugs formed in the upper one of the two adjacent insulating interlayer structures, whereby the peeling of the SiN and $SiO_2$ layers from the SOG layer can be prevented.

Each of the aforesaid semiconductor devices (bare chips) is used to manufacture a molded-resin semiconductor package. In this case, as well known, the semiconductor device is subjected to a wire-bonding process in which a gold wire is bonded and connected to each of the electrode pads on the semiconductor device. Also, when the semiconductor device is of a flip-chip type, a metal bump is bonded and connected to each of the electrode pads on the semiconductor device. In either event, each of the electrode pads is subjected to physical stresses when bonding and connecting either the gold wire or the metal bump thereto, and thus cracks may be produced in the insulating interlayer structures included in the multi-layered wiring arrangement.

In order to prevent the production of the cracks in the insulating interlayer structures, it has been already proposed that reinforcing metal patterns be incorporated in the multi-layered wiring arrangement below each of the electrode pads, as disclosed in JP-A-2003-031611.

On the other hand, with the recent advance of miniaturization of semiconductor devices, a signal-transmission path included in the metal wiring layout patterns formed becomes narrower. Of course, the narrower the signal-transmission path, the larger resistance of the signal-transmission path, resulting in delay of signal transmission in the signal-transmission path.

Conventionally, in general, although the metal wiring layout patterns are made of aluminum, there is a recent trend toward use of copper, exhibiting a smaller specific resistance than that of aluminum, for the metal wiring layout pattern, whereby the signal transmission can be facilitated in the signal-transmission paths of the metal wiring layout pattern.

Also, the signal-transmission paths included in the metal wiring layout pattern become closer to each other for the miniaturization of semiconductor devices, and thus a parasitic capacitance is produced between adjacent signal-transmission paths because the silicon dioxide layer serves as a dielectric therebetween. Of course, the production of the parasitic capacitance results in delay of signal transmission in the signal-transmission paths. In short, the miniaturization of the semiconductor devices has advanced to a degree in which a magnitude of a dielectric constant of the silicon dioxide layer cannot be neglected.

Thus, in the production of the semiconductor devices, it has been proposed that a low-k material having a smaller dielectric constant than that of silicon dioxide ($SiO_2$) be used to form the insulating interlayer structures of the multi-layered wiring arrangement, to thereby suppress the production of the parasitic capacitance. Note, for the low-k material, SiOCH is representatively used.

In general, since it is difficult to minutely process a copper layer by using a dry etching process to thereby produce a copper wiring layout pattern, a damascene process is used for the production of the minute copper wiring layout pattern.

As well known, a low-k insulating layer made of the low-k material exhibits a lower density than that of a silicon dioxide layer, and thus the physical strength of the low-k insulating layer is inferior to that of the silicon dioxide layer. Also, the low-k insulating layer exhibits an inferior adhesion property with respect to another insulating layer, such as a silicon dioxide layer or the like.

Accordingly, in the production of the multi-layered wiring arrangement, when an insulating interlayer structure is constituted by using the low-k material, cracks are liable to be produced in a low-k insulating layer due to thermal stresses and/or physical stresses. Also, in the aforesaid damascene process, a chemical and mechanical polishing (CMP) process is involved to polish a copper layer for producing a copper wiring layout pattern, and thus peeling is liable to occur in the low-k insulting layer due to physical stresses produced in the insulating interlayer structures during the CMP process.

SUMMARY OF THE INVENTION

Therefore, an object of the present invention is to provide a semiconductor device with a multi-layered wiring arrangement, including a low-k insulating layer, which is reinforced so that production of cracks and occurrence of peeling in the low-k insulating layer can be effectively prevented.

Another object of the present invention is to provide a production method for manufacturing such a semiconductor device.

In accordance with a first aspect of the present invention, there is provided a semiconductor device comprising a semiconductor substrate having electronic elements produced therein, an insulating underlayer formed thereon, and a multi-layered wiring arrangement constructed on the insulating underlayer semiconductor substrate. The multi-layered wiring arrangement includes at least three insulating interlayer structures: a first insulating interlayer structure formed on the insulating underlayer; a second insulating interlayer structure; and a third insulating interlayer structure formed on the first insulating interlayer structure, each of the first, second and third insulating interlayer structures including a low-k insulating layer, each of the first and third insulating interlayer structures having at least one reinforcing element formed therein, the second insulating interlayer structure having a joint plug formed therein, the reinforcing elements of the first and third insulating interlayer structures being connected to each other through the joint plug.

The reinforcing elements and the joint plug define a reinforcing column extending through the first, second and third insulating interlayer structures. In a preferable embodiment, a plurality of reinforcing columns are defined in the multi-layered wiring arrangement so as to extend through the first, second and third insulating interlayer structures. The multi-layered wiring arrangement further includes an uppermost insulating interlayer structure having a plurality of electrode pads formed therein, and the reinforcing columns may be arranged around each of the electrode pads in the multi-layered wiring arrangement. In this case, the reinforcing elements, included in two adjacent ones of the reinforcing columns, are integrated with each other to thereby produce a beam-like reinforcing element.

On the other hand, The reinforcing columns may be entirely and uniformly distributed in the multi-layered wiring arrangement. Also, the reinforcing columns may be closely arranged along sides of the multi-layered wring arrangement. Further, the reinforcing columns may be closely arranged at corner areas of the multi-layered wring arrangement.

The multi-layered wiring arrangement may further include at least one oxide insulating interlayer structure having an oxide insulating layer formed therein, and the at least one oxide insulating interlayer structure is provided above the at least three insulating interlayer structures. In this case, the oxide insulating interlayer structure has a wiring layout pattern formed therein, and a part of the wiring layout pattern may be positioned above a reinforcing column defined by alternately connecting the reinforcing elements and the joint plug.

According to the present invention, the insulating underlayer may have a joint plug formed therein. In this case, one end of the joint plug is connected to the semiconductor substrate, and the other end thereof is connected to the reinforcing element formed in the first insulating interlayer structure.

The multi-layered wiring arrangement may further include a fourth insulating interlayer structure formed on the third insulating interlayer structure and including a low-k insulating layer, and the fourth insulating interlayer structure has a joint plug which is formed therein so as to be in non-alignment with the joint plug formed in the second insulating interlayer structure. In this case, the reinforcing element formed in the third insulating interlayer structure is formed as an elongated reinforcing element, the joint plug formed in the second insulating interlayer being connected to one end of the elongated reinforcing element, the joint plug formed in the fourth insulating interlayer structure being connected to the other end of the elongated reinforcing element.

Each of the reinforcing elements formed in the respective first and third insulating interlayer structures may be formed as a frame-like reinforcing element extending along sides of the multi-layered wiring arrangement. In this case, the joint plug formed in the second insulating interlayer structure is also formed as a frame-like joint plug extending along the sides of the multi-layered wiring arrangement, and the frame-like reinforcing elements is thicker than the frame-like joint plug. The frame-like reinforcing elements and the frame-like joint plug define a reinforcing wall extending through the first, second and third insulating interlayer structures. In this case, the insulating underlayer may have a frame-like joint plug formed therein, and the frame-like joint plug has substantially the same contour as the frame-like joint formed in the second insulating interlayer structure, and is connected to the semiconductor substrate and the frame-like reinforcing element formed in the first insulating interlayer structure.

In accordance with a second aspect of the present invention, there is provided a production method for manufacturing a semiconductor device comprising the steps of: preparing a semiconductor substrate having an electronic element produced therein; forming an insulating underlayer on the semiconductor substrate; forming a first insulating interlayer structure on the insulating underlayer, the first insulating interlayer structure including a low-k insulating layer; forming a reinforcing element in the low-k insulating layer of the first insulating interlayer structure while forming a wiring layout pattern therein; forming a second insulating interlayer structure on the first insulating interlayer structure, the second insulating interlayer structure including a low-k insulating layer; forming a joint plug in the low-k insulating layer of the second insulating interlayer structure while forming a via plug therein, the joint plug being connected to the reinforcing element formed in the first insulating interlayer structure; forming a third insulating interlayer structure on the second insulating interlayer structure, the third insulating interlayer structure including a low-k insulating layer; and forming a reinforcing element in the low-k insulating layer of the third insulating interlayer structure while forming a wiring layout pattern therein, the reinforcing element formed in the third insulating interlayer structure being connected to the joint plug formed in the second insulating interlayer structure.

This production method may further comprise a step of forming a joint plug in the insulating underlayer while forming a contact plug therein to electrically connect the electronic element to the wiring layout pattern formed in the first insulating interlayer structure, the joint plug formed in the insulating interlayer being connected to the semiconductor substrate and the reinforcing element formed in the first insulating interlayer structure.

In accordance with a third aspect of the present invention, there is provided a production method for manufacturing a semiconductor device comprising the steps of: preparing a semiconductor substrate having an electronic element produced therein; forming an insulating underlayer on the semiconductor substrate; forming a first insulating interlayer structure on the insulating underlayer, the first insulating interlayer structure including a low-k insulating layer; forming a reinforcing element in the low-k insulating layer of the first insulating interlayer structure while forming a wiring layout pattern therein; forming a second insulating interlayer structure and a third insulating interlayer structure in order on the first insulating interlayer structure, each of the second and third insulating interlayer structures including a low-k insulating layer; and forming both a joint plug and a reinforcing element in the respective low-k layers of the second and third insulating interlayer structures while forming both a via plug and a wiring layout pattern therein, the joint plug being connected to the reinforcing element formed in the first insulating interlayer structure.

BRIEF DESCRIPTION OF THE DRAWINGS

The above objects and other objects will be more clearly understood from the description set forth below, with reference to the accompanying drawings, wherein:

FIG. 5 is a partial cross-sectional view of a second embodiment of the semiconductor device according to the present invention;

FIG. 7A is a plan view of a fourth embodiment of the semiconductor device according to the present invention;

FIG. 7B is a cross-sectional view taken along the 7B—7B line of FIG. 7A;

DESCRIPTION OF THE PREFERRED EMBODIMENTS

With reference to FIGS. 1A to 1N, 1P and 1Q, a first embodiment of a production method for producing a plurality of semiconductor devices in a silicon wafer, according to the present invention, will be now explained below.

Figure 1A:
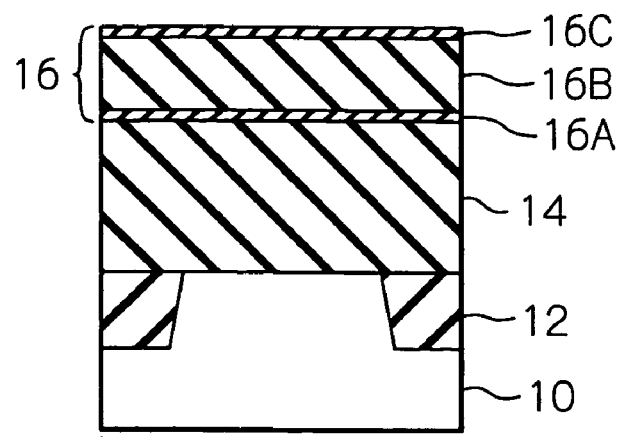
FIG. 1A is a partial cross-sectional view of a silicon wafer, showing a first representative step of a first embodiment of a production method for manufacturing a plurality of semiconductor devices therein according to the present invention.

First, referring to FIG. 1A, a part of a semiconductor substrate 10, defining a semiconductor chip area on a silicon wafer, is illustrated in a vertical cross-sectional view. As shown in this drawing, an element-isolation layer 12 is formed in the semiconductor substrate 10. Note, although not visible in FIG. 1A, various elements, such as transistors, resistors, capacitors and so on, are produced in areas surrounded by the element-isolation layer 12.

After the production of the various elements is completed, a silicon dioxide layer 14 is formed as an insulating underlayer on the surface of the silicon wafer. Although not visible in FIG. 1A, contact plugs are formed in the insulating underlayer 14, and each of the contact plugs is electrically connected to a corresponding element produced in the semiconductor substrate 10. Note, in this embodiment, the contact plugs are made of tungsten (W).

After the formation of the contact plugs is completed, a multi-layered wiring arrangement including at least three insulating interlayer structures is constructed on the insulating underlayer 14, using a damascene process.

In particular, as shown in FIG. 1A, a lowermost or first insulating interlayer structure 16 is formed on the insulating underlayer 14. In this embodiment, the first insulating interlayer structure 16 is composed of an etching stopper layer 16A formed on the insulating underlayer 14, a low-k insulating layer 16B formed on the etching stopper layer 16A, and a thin protective layer 16C formed on the low-k insulating layer 16B.

The etching stopper layer 16A is made of silicon nitride (SiN), SiCN, or the like, and the formation of the etching stopper layer 16A may be carried out, using a suitable chemical vapor deposition (CVD) process.

Also, the low-k insulating layer 16B is made of SiOCH, and the formation of the low-k insulating layer 16B may be carried out, using either a suitable CVD process or a coating/baking process. In this embodiment, although SiOCH, which is known as a representative low-k material, is used for low-k insulating layer 16B, the low-k insulating layer 16B may be made of another low-k material, such as, L-Ox (Registered Trademark: ladder hydrogenated siloxane), SiOC, SiOF, HSQ (hydrogen-silsesquioxane), MSQ (methyl-silsesquioxane) or the like.

The thin protective layer 16C may be composed of silicon dioxide, and the formation of the thin protective layer 16C may be carried out, using a suitable CVD process. In the aforesaid damascene process, since the silicon wafer is exposed to an oxidizing atmosphere, it is necessary to protect the low-k insulating layer from the oxidizing atmosphere by the thin protective layer 16C, because the low-k insulating layer or SiOCH insulating layer exhibits an oxidation resistance property which is inferior to that of the thin protective (silicon dioxide) layer 16C, i.e. because the SiOCH insulating layer 16B is liable to be oxidized due to a carbon component (C) contained therein.

Figure 1B:
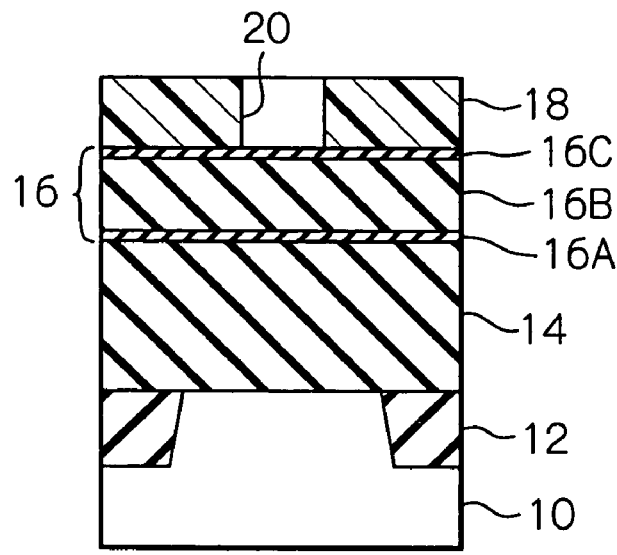
FIG. 1B is a partial cross-sectional view, similar to FIG. 1A, showing a second representative step of the first embodiment of the production process according to the present invention.

After the formation of the first insulating interlayer structure 16, a photoresist layer 18 is formed on the first insulating interlayer structure 16, as shown in FIG. 1B, and is patterned and produced as a photo mask layer by using a photolithography process and an etching process. Namely, the patterned photoresist layer or photo mask layer 18 has respective plural sets of openings formed therein above the semiconductor chip areas on the silicon wafer. A part of the openings in each set corresponds to a wiring layout pattern to be formed in the first insulating interlayer structure 16 above a corresponding semiconductor chip area on the silicon wafer, and the remaining part of the openings corresponds to a reinforcing pattern to be formed in the first insulating interlayer structure 16 above that semiconductor chip area. Note, the reinforcing pattern includes a plurality of reinforcing elements, and, in FIG. 1B, the opening, corresponding to one of the reinforcing elements, is indicated by reference 20.

Figure 1C:
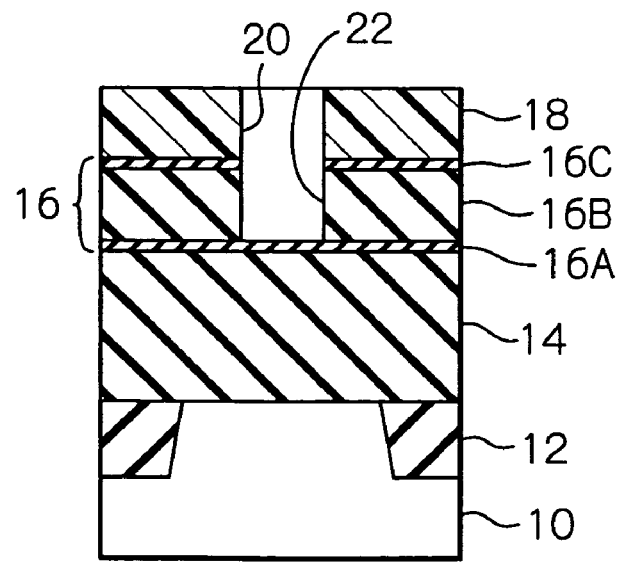
FIG. 1C is a partial cross-sectional view, similar to FIG. 1B, showing a third representative step of the first embodiment of the production process according to the present invention.

After the formation of the patterned photoresist layer or photo mask layer 18, the first insulating interlayer structure 16 is subjected to an anisotropic etching process or dry etching process at a low energy level, in which respective plural sets of trenches, corresponding to the plural sets of the openings of the photo mask layer 18, are formed in both the thin protective layer 16C and the low-k insulating layer 16B, as representatively shown in FIG. 1C. Note, in FIG. 1C, a trench, corresponding to the opening 20 (FIG. 1B), is indicated by reference 22.

Figure 1D:
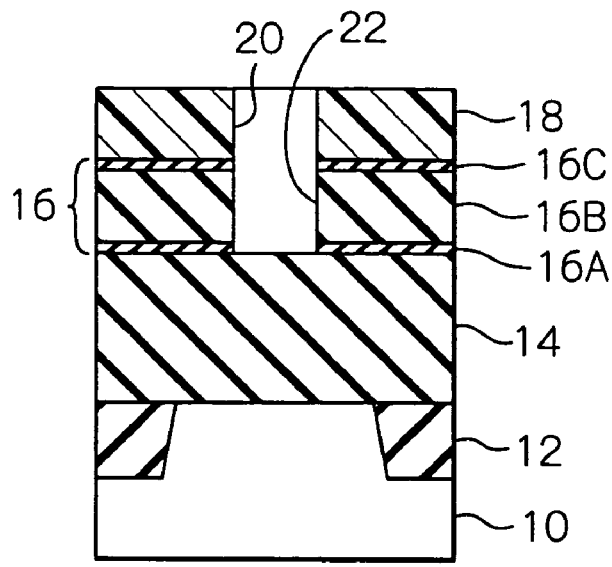
FIG. 1D is a partial cross-sectional view, similar to FIG. 1C, showing a fourth representative step of the first embodiment of the production process according to the present invention.

Then, the first insulating interlayer structure 16 is further subjected to an anisotropic etching process or dry etching process at a high energy level, the etching stopper layer 16A is removed from the bottoms of the trenches (22), as representatively shown in FIG. 1D.

Figure 1E:
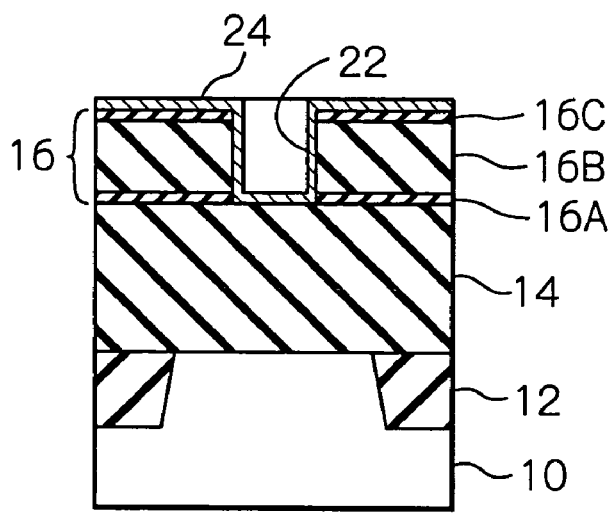
FIG. 1E is a partial cross-sectional view, similar to FIG. 1D, showing a fifth representative step of the first embodiment of the production process according to the present invention.

After the dry etching process at the high energy level is completed, the photo mask layer 18 is removed from the first insulating interlayer structure 16, and then the patterned insulating interlayer structure 16 is subjected to a sputtering process in which a barrier metal layer 24 is formed on the first insulating interlayer structure 16, as representatively shown in FIG. 1E, with side wall faces and bottom wall faces of the trenches (22) being covered with the barrier metal layer 24.

Note that the barrier metal layer 24 may be composed of a suitable metal material, such as titanium (Ti), titanium nitride (TiN), tantalum (Ta), tantalum nitride (TaN) or the like. Also, note that the barrier metal layer 24 may be composed of a titanium compound, such as TiSiN or the like, and may be formed by combining one of Ti, TiN and TiSiN layers with another layer. Further, note that the barrier metal layer 24 may be composed of a tantalum compound, such as TaSiN or the like, and may be formed by combining one of Ta, TaN and TaSiN layers with another layer.

Figure 1F:
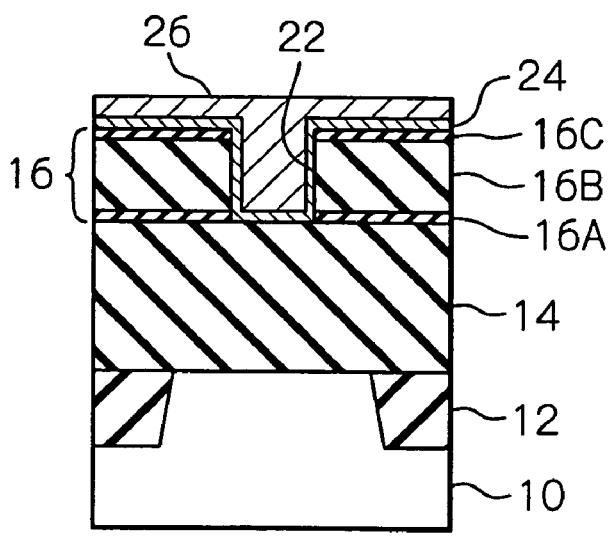
FIG. 1F is a partial cross-sectional view, similar to FIG. 1E, showing a sixth representative step of the first embodiment of the production process according to the present invention.

After the formation of the barrier metal layer 24 is completed, a copper (Cu) layer 26 is formed on the barrier metal layer 24 such that all the trenches (22) are filled with copper (Cu), as representatively shown in FIG. 1F. In particular, first, a copper (Cu) seed layer is formed on the barrier metal layer 24, using a sputtering process, and then the formation of the Cu layer 26 is carried out, using an electroplating process in which the Cu seed layer serves as a cathode electrode. Then, the Cu layer 26 is subjected to an annealing process for crystallization.

Figure 1G:
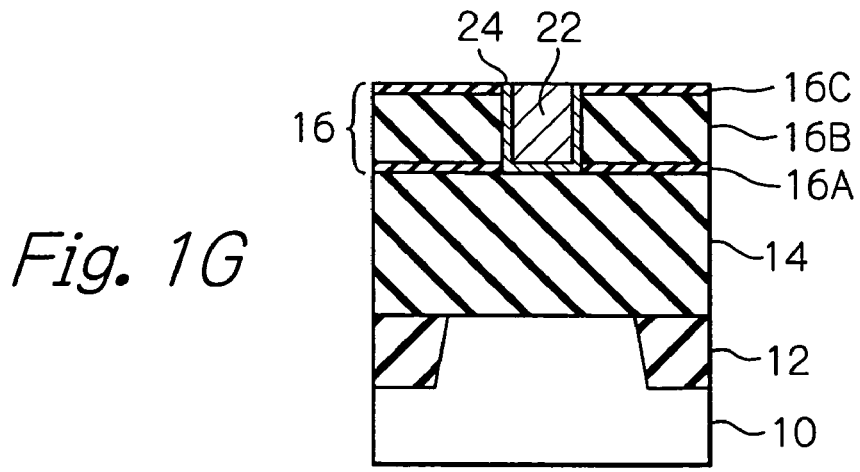
FIG. 1G is a partial cross-sectional view, similar to FIG. 1F, showing a seventh representative step of the first embodiment of the production process according to the present invention.

After the annealing process is completed, the silicon wafer is set in a chemical mechanical polishing (CMP) apparatus, and both the Cu layer 26 and the barrier metal layer 24 are chemically and mechanically polished so that the redundant metals (Cu and e.g. Ti) are removed therefrom, resulting in formation of both a copper wiring layout pattern and a copper reinforcing pattern in the first insulating interlayer structure 16 above each of the semiconductor areas on the silicon wafer, as representatively shown in FIG. 1G. Note, in FIG. 1G, one of the reinforcing elements forming the copper reinforcing pattern is indicated by reference 28.

Figure 1H:
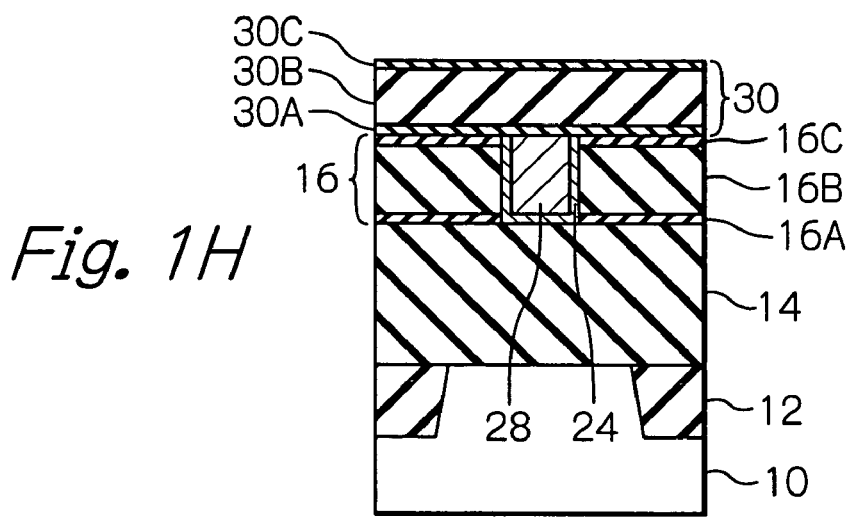
FIG. 1H is a partial cross-sectional view, similar to FIG. 1G, showing an eighth representative step of the first embodiment of the production process according to the present invention.

Next, as shown in FIG. 1H, a second insulating interlayer structure 30 is formed on the first insulating interlayer structure 16. The second insulating interlayer structure 30 is composed of an etching stopper layer 30A formed on the first insulating interlayer structure 16, a low-k insulating layer 30B formed on the etching stopper layer 30A, and a thin protective layer 30C formed on the low-k insulating layer 30B. Note, the etching stopper layer 30A also serves as a metal-diffusion prevention layer, by which copper is prevented from being diffused from both the copper wiring layout patterns and the copper reinforcing patterns (28) of the first insulating interlayer structure 16 into the low-k insulating layer 30B.

Similar to the etching stopper layer 16A, the etching stopper layer or metal-diffusion prevention layer 30A is made of silicon nitride (SiN), SiCN, or the like, and the formation of the metal-diffusion prevention layer 30A is carried out, using a suitable CVD process. Also, the low-k insulating layer 30B is made of SiOCH, and the formation of the low-k insulating layer 30B may be carried out, using either a suitable CVD process or a coating/baking process. Of course, one of the aforesaid other low-k materials may be used for the low-k insulating layer 30B. Further, the thin protective layer 30C is made of silicon dioxide for the same reason as mentioned above.

Figure 1I:
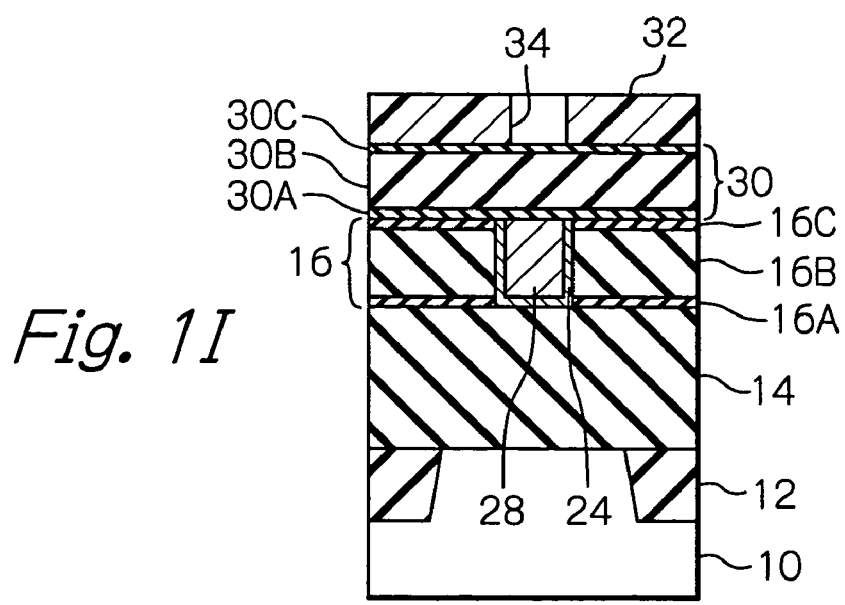
FIG. 1I is a partial cross-sectional view, similar to FIG. 1H, showing a ninth representative step of the first embodiment of the production process according to the present invention.

After the formation of the second insulating interlayer structure 30, as shown in FIG. 1I, a photoresist layer 32 is formed on the second insulating interlayer structure 30, and is patterned and produced as a photo mask layer by using a photolithography process and an etching process. Namely, the patterned photoresist layer or photo mask layer 32 has respective plural sets of holes formed therein above the semiconductor chip areas on the silicon wafer. A part of the holes in each set corresponds to via plugs to be formed in the second insulating interlayer structure 30 and to be connected to a corresponding wiring layout pattern formed in the first insulating interlayer structure 16, and the remaining part of the holes corresponds to joint plugs to be formed in the second insulating interlayer structure 30 and to be connected to the reinforcing elements (28) of the reinforcing pattern. Note, in FIG. 1I, a hole, corresponding to one of the joint plugs to be connected to the reinforcing element 28, is indicated by reference 34.

Figure 1J:
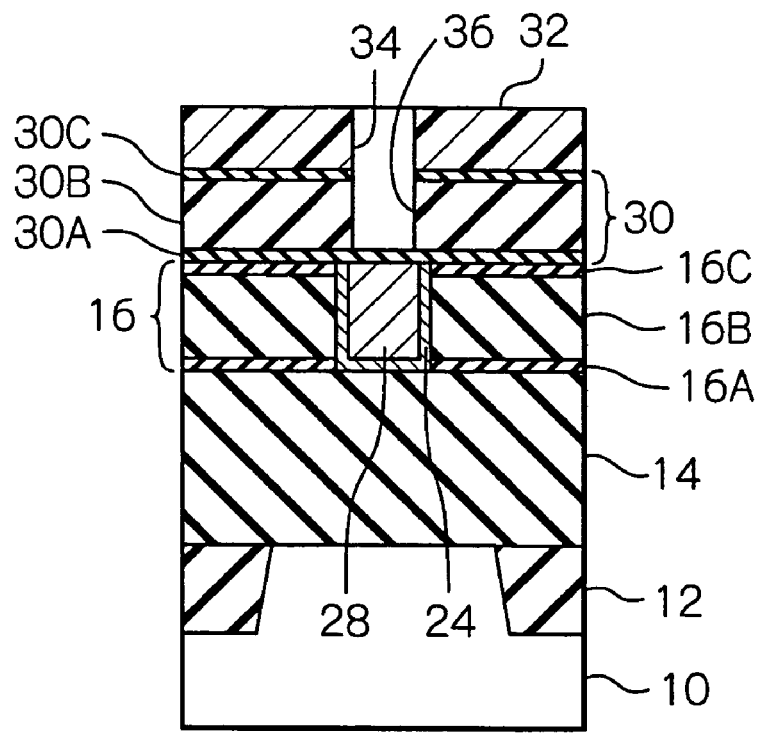
FIG. 1J is a partial cross-sectional view, similar to FIG. 1I, showing a tenth representative step of the first embodiment of the production process according to the present invention.

After the formation of the patterned photoresist layer or photo mask layer 32, the second insulating interlayer structure 30 is subjected to an anisotropic etching process or dry etching process at a low energy level, in which respective plural sets of holes, corresponding to the plural sets of the holes of the photo mask layer 32, are formed in both the thin protective layer 30C and the low-k insulating layer 30B, as representatively shown in FIG. 1J. Note, in FIG. 1J, a hole, corresponding to the hole 34 (FIG. 1I), is indicated by reference 36.

Figure 1K:
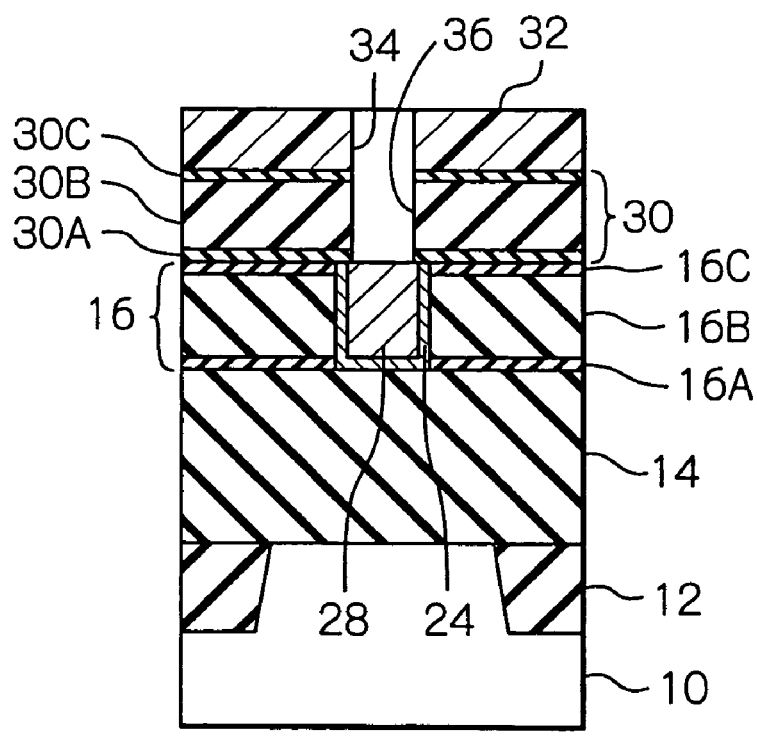
FIG. 1K is a partial cross-sectional view, similar to FIG. 1J, showing an eleventh representative step of the first embodiment of the production process according to the present invention.

Then, the second insulating interlayer structure 30 is further subjected to an anisotropic etching process or dry etching process at a high energy level, the etching stopper layer 30A is removed from the bottoms of the holes (36), as representatively shown in FIG. 1K.

Figure 1L:
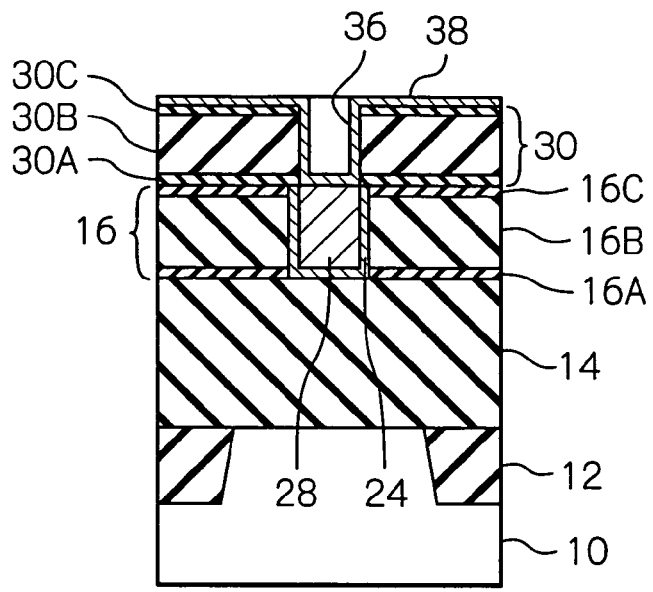
FIG. 1L is a partial cross-sectional view, similar to FIG. 1K, showing a twelfth representative step of the first embodiment of the production process according to the present invention.

After the dry etching process at the high energy level is completed, the photo mask layer 32 is removed from the second insulating interlayer structure 30, and then the patterned insulating interlayer structure 30 is subjected to a sputtering process in which a barrier metal layer 38 is formed on the second insulating interlayer structure 30, as representatively shown in FIG. 1L, with side wall faces and bottom wall faces of the holes (36) being covered with the barrier metal layer 38.

Note, similar to the barrier metal layer 24, the barrier metal layer 38 may be composed of any one of the aforesaid various metal materials and metal compound materials.

Figure 1M:
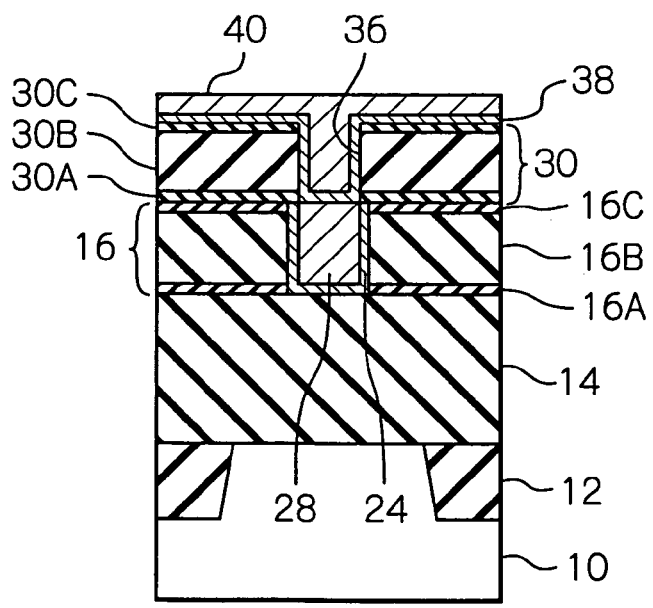
FIG. 1M is a partial cross-sectional view, similar to FIG. 1L, showing a thirteenth representative step of the first embodiment of the production process according to the present invention.

After the formation of the barrier metal layer 38 is completed, a copper (Cu) layer 40 is formed on the barrier metal layer 38 such that all the holes (36) are filled with copper (Cu), as representatively shown in FIG. 1M. In particular, first, a copper (Cu) seed layer is formed on the barrier metal layer 38, using a sputtering process, and then the formation of the Cu layer 40 is carried out, using an electroplating process in which the Cu seed layer serves as a cathode electrode. Then, the Cu layer 40 is subjected to an annealing process for crystallization.

Figure 1N:
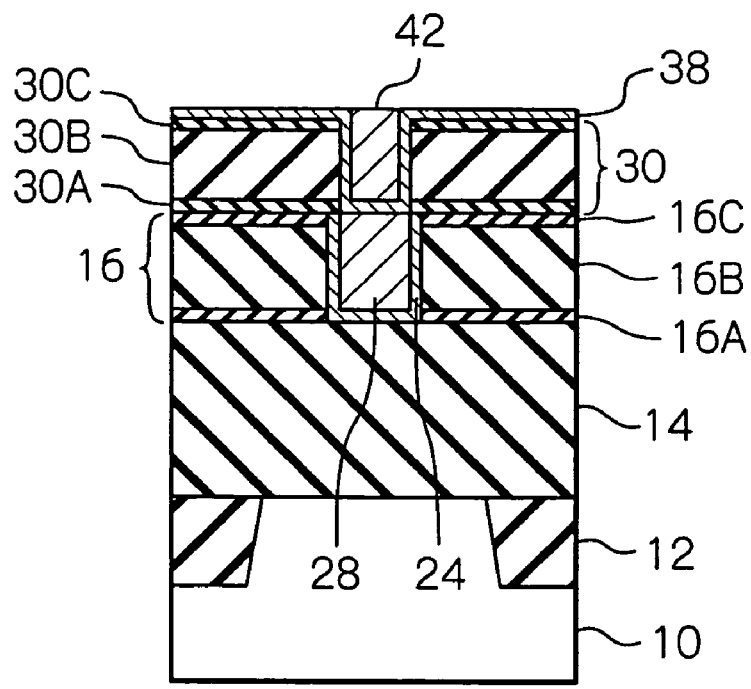
FIG. 1N is a partial cross-sectional view, similar to FIG. 1M, showing a fourteenth representative step of the first embodiment of the production process according to the present invention.

After the annealing process is completed, the silicon wafer is set in a chemical mechanical polishing (CMP) apparatus, and both the Cu layer 40 and the barrier metal layer 38 are chemically and mechanically polished so that the redundant metals (Cu and e.g. Ti) are removed therefrom, resulting in formation of both a set of copper via plugs and a set of copper joint plugs in the second insulating interlayer structure 30 above each of the semiconductor areas on the silicon wafer, as representatively shown in FIG. 1N. Note, in FIG. 1N, one of the joint plugs is indicated by reference 42.

Figure 1P:
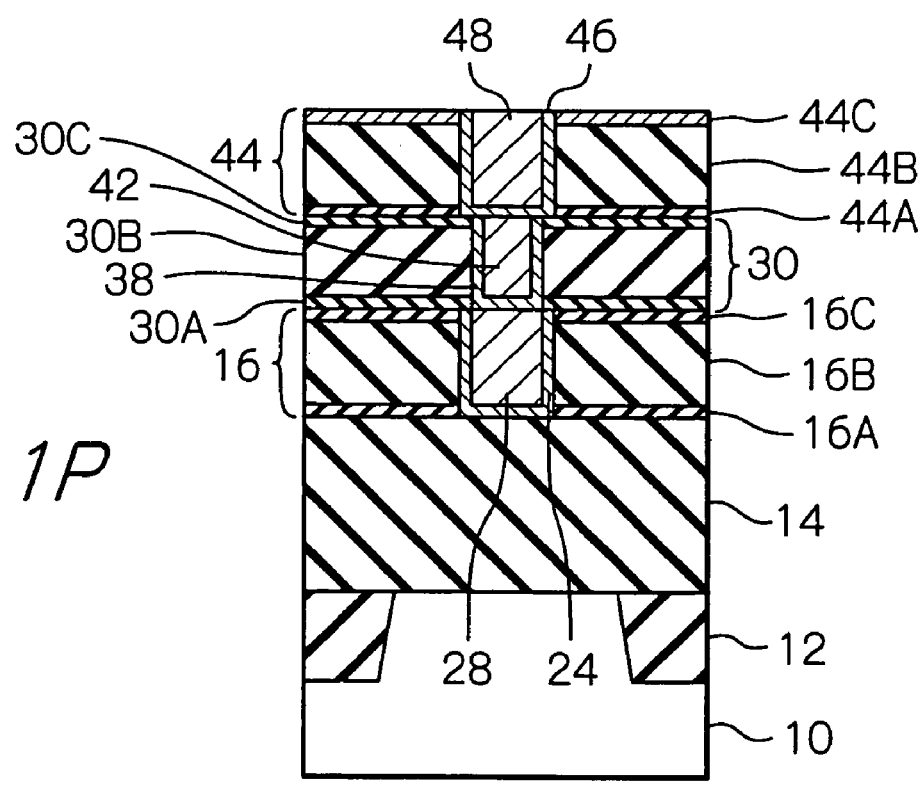
FIG. 1P is a partial cross-sectional view, similar to FIG. 1N, showing a fifteenth representative step of the first embodiment of the production process according to the present invention.

Next, as shown in FIG. 1P, a third insulating interlayer structure 44 is formed on the second insulating interlayer structure 30 in substantially the same manner as the first insulating interlayer structure 16. Namely, the third insulating interlayer structure 44 is composed of an etching stopper layer 44A formed on the second insulating interlayer structure 30, a low-k insulating layer 30B formed on the etching stopper layer 44A and having plural sets of wiring layout patterns and plural sets of reinforcing patterns for the semiconductor chips on the silicon wafer, and a thin protective layer 44C formed on the low-k insulating layer 44B. Note, the etching stopper layer 44A also serves as a metal-diffusion prevention layer, by which copper is prevented from being diffused from both the copper via plugs and the copper joint plugs (42) of the second insulating interlayer structure 30 into the low-k insulating layer 44B. Also, note, in FIG. 1P, reference 46 indicates a barrier metal layer, and reference 48 indicates one of reinforcing elements forming the copper reinforcing pattern concerned.

Figure 1Q:
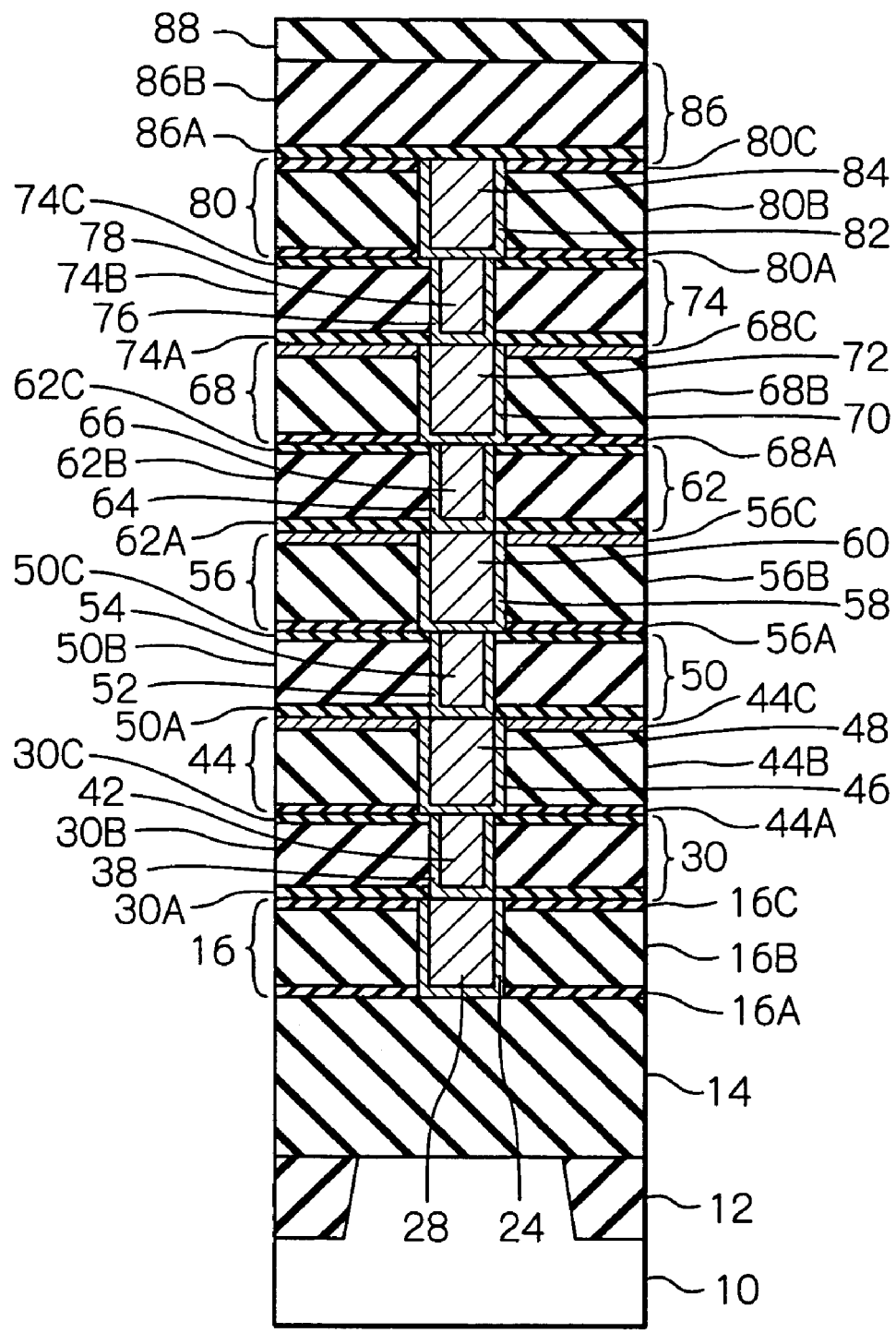
FIG. 1Q is a partial cross-sectional view, similar to FIG. 1P, showing a sixteenth representative step of the first embodiment of the production process according to the present invention.

Subsequently, if necessary, an insulating interlayer structure, having plural sets of via plugs and plural sets of joint plugs, and an insulating interlayer structure, having plural sets of wiring layout patterns and plural sets of reinforcing patterns, are alternately formed on the third insulating interlayer structure 44, as shown in FIG. 1Q by way of example.

In particular, in the example shown in FIG. 1Q, a fourth insulating interlayer structure 50 is formed on the third insulating interlayer structure 44 in substantially the same manner as the second insulating interlayer structure 30. Namely, the fourth insulating interlayer structure 50 is composed of an etching stopper layer 50A formed on the third insulating interlayer structure 44, a low-k insulating layer 50B formed on the etching stopper layer 50A and having plural sets of via plugs and plural sets of joint plugs for the semiconductor chips on the silicon wafer, and a thin protective layer 50C formed on the low-k insulating layer 50B. Note, the etching stopper layer 50A also serves as a metal-diffusion prevention layer, by which copper is prevented from being diffused from both the copper wiring layout patterns and the copper reinforcing patterns (48) of the third insulating interlayer structure 44 into the low-k insulating layer 50B. Also, note, in FIG. 1Q, reference 52 indicates a barrier metal layer, and reference 54 indicates one of the joint plugs concerned.

Also, in the example shown in FIG. 1Q, a fifth insulating interlayer structure 56 is formed on the fourth insulating interlayer structure 50 in substantially the same manner as the first insulating interlayer structure 16. Namely, the fifth insulating interlayer structure 56 is composed of an etching stopper layer 56A formed on the fourth insulating interlayer structure 50, a low-k insulating layer 56B formed on the etching stopper layer 56A and having plural sets of wiring layout patterns and plural sets of reinforcing patterns for the semiconductor chips on the silicon wafer, and a thin protective layer 56C formed on the low-k insulating layer 56B. Note, the etching stopper layer 56A also serves as a metal-diffusion prevention layer, by which copper is prevented from being diffused from both the copper via plugs and the copper joint plugs (54) of the fourth insulating interlayer structure 50 into the low-k insulating layer 56B. Also, note, in FIG. 1Q, reference 58 indicates a barrier metal layer, and reference 60 indicates one of reinforcing elements forming the copper reinforcing pattern concerned.

Further, in the example shown in FIG. 1Q, a sixth insulating interlayer structure 62 is formed on the fifth insulating interlayer structure 56 in substantially the same manner as the second insulating interlayer structure 30. Namely, the sixth insulating interlayer structure 62 is composed of an etching stopper layer 62A formed on the fifth insulating interlayer structure 56, a low-k insulating layer 62B formed on the etching stopper layer 62A and having plural sets of via plugs and plural sets of joint plugs for the semiconductor chips on the silicon wafer, and a thin protective layer 62C formed on the low-k insulating layer 56B. Note, the etching stopper layer 62A also serves as a metal-diffusion prevention layer, by which copper is prevented from being diffused from both the copper wiring layout patterns and the copper reinforcing patterns (60) of the fifth insulating interlayer structure 56 into the low-k insulating layer 62B. Also, note, in FIG. 1Q, reference 64 indicates a barrier metal layer, and reference 66 indicates one of the joint plugs concerned.

Further, in the example shown in FIG. 1Q, a seventh insulating interlayer structure 68 is formed on the sixth insulating interlayer structure 62 in substantially the same manner as the first insulating interlayer structure 16. Namely, the seventh insulating interlayer structure 68 is composed of an etching stopper layer 68A formed on the sixth insulating interlayer structure 62, a low-k insulating layer 68B formed on the etching stopper layer 68A and having plural sets of wiring layout patterns and plural sets of reinforcing patterns for the semiconductor chips on the silicon wafer, and a thin protective layer 68C formed on the low-k insulating layer 68B. Note, the etching stopper layer 68A also serves as a metal-diffusion prevention layer, by which copper is prevented from being diffused from both the copper via plugs and the copper joint plugs (66) of the sixth insulating interlayer structure 62 into the low-k insulating layer 68B. Also, note, in FIG. 1Q, reference 70 indicates a barrier metal layer, and reference 72 indicates one of reinforcing elements forming the copper reinforcing pattern concerned.

Further, in the example shown in FIG. 1Q, an eighth insulating interlayer structure 74 is formed on the seventh insulating interlayer structure 68 in substantially the same manner as the second insulating interlayer structure 30. Namely, the eighth insulating interlayer structure 74 is composed of an etching stopper layer 74A formed on the seventh insulating interlayer structure 78, a low-k insulating layer 74B formed on the etching stopper layer 74A and having plural sets of via plugs and plural sets of joint plugs for the semiconductor chips on the silicon wafer, and a thin protective layer 74C formed on the low-k insulating layer 74B. Note, the etching stopper layer 74A also serves as a metal-diffusion prevention layer, by which copper is prevented from being diffused from both the copper wiring layout patterns and the copper reinforcing patterns (72) of the seventh insulating interlayer structure 68 into the low-k insulating layer 74B. Also, note, in FIG. 1Q, reference 76 indicates a barrier metal layer, and reference 78 indicates one of the joint plugs concerned.

Further, in the example shown in FIG. 1Q, a ninth insulating interlayer structure 80 is formed on the eighth insulating interlayer structure 74 in substantially the same manner as the first insulating interlayer structure 16. Namely, the ninth insulating interlayer structure 80 is composed of an etching stopper layer 80A formed on the eighth insulating interlayer structure 74, a low-k insulating layer 80B formed on the etching stopper layer 80A and having plural sets of wiring layout patterns and plural sets of reinforcing patterns for the semiconductor chips on the silicon wafer, and a thin protective layer 80C formed on the low-k insulating layer 80B. Note, the etching stopper layer 80A also serves as a metal-diffusion prevention layer, by which copper is prevented from being diffused from both the copper via plugs and the copper joint plugs (78) of the eighth insulating interlayer structure 68 into the low-k insulating layer 80B. Also, note, in FIG. 1Q, reference 82 indicates a barrier metal layer, and reference 84 indicates one of reinforcing elements forming the copper reinforcing pattern concerned.

After the formation of the ninth insulating interlayer structure 80 is completed, a tenth insulating interlayer structure 86 is formed as an uppermost insulating interlayer structure 88 on the ninth insulating interlayer structure 80, as shown in FIG. 1Q. The uppermost insulating interlayer structure 86 is composed of an etching stopper layer or metal-diffusion prevention layer 86A formed on the ninth insulating interlayer structure 80, and a silicon dioxide layer 86B formed on the metal-diffusion prevention layer 86A. Then, the uppermost insulating interlayer structure 86 is patterned, using a photolithography process and an etching process, such that plural sets of electrode pad openings (not visible in FIG. 1Q) are formed in the uppermost insulating interlayer structure 86 for the semiconductor chip areas on the silicon wafer. Subsequently, the electrode openings are filled with a suitable metal material, such as a nickel/copper alloy, a titanium/tungsten alloy or the like, using a sputtering process, resulting in formation of electrode pads in the uppermost insulating interlayer structure 86. Of course, the electrode pads are suitably and electrically connected to the wiring layout pattern formed in the ninth insulating interlayer structure 80.

After the uppermost insulating interlayer structure 86 is completed, a passivation layer 88 is formed as a protective layer on the uppermost insulating interlayer structure 86, and is perforated, using a photolithography process and an etching process, such that the electrode pads are exposed to the outside. Thereafter, the silicon wafer is subjected to a dicing process, in which the silicon wafer is cut along the scribe lines, whereby the semiconductor chip areas are separated from each other as semiconductor devices (bare chips).

Note that the produced semiconductor device is referred to as a first embodiment of a semiconductor device according to the present invention hereinafter.

As stated hereinbefore, the low-k insulating layers 16B, 30B, 44B, 50B, 56B, 62B, 68B, 74B and 80B exhibit an inferior physical strength and an inferior adhesion property. Nevertheless, according to the present invention, the reinforcing elements 28, 48, 60, 72 and 84 and the joint plugs 42, 54, 66 and 78 are alternately connected to each other so as to define a reinforcing column extending through the insulating interlayer structures 16, 30, 44, 50, 56, 62, 68, 74 and 80, whereby the insulating interlayer structures 16, 30, 44, 50, 56, 62, 68, 74 and 80 are physically and mechanically anchored to each other by the reinforcing column, resulting in physical and mechanical reinforcement of the low-k insulating layers 16B, 30B, 44B, 50B, 56B, 62B, 68B, 74B and 80B. Namely, for example, since the second insulating interlayer structure 30 is physically and mechanically anchored to the first and third insulating interlayer structures 16 and 44 by connecting the reinforcing elements 28 and 48 to each other through the joint plug 42, it is possible to physically and mechanically reinforce the second insulating interlayer structure 30.

Figure 2A:
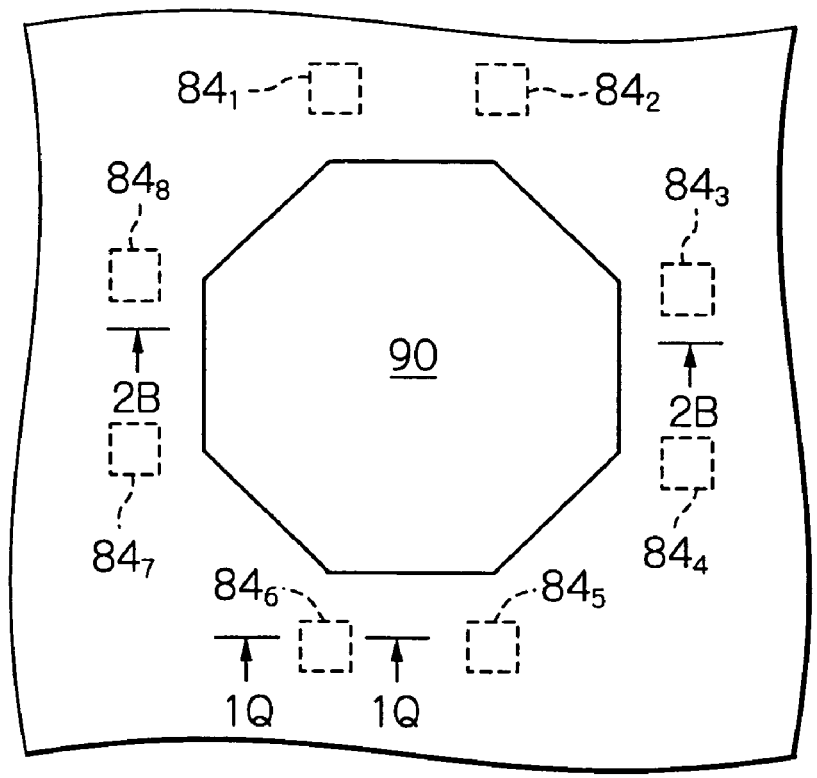
FIG. 2A is a plan view showing a part of an upper surface of a semiconductor device manufactured as a first embodiment by the first embodiment of the production process according to the present invention.
Figure 2B:
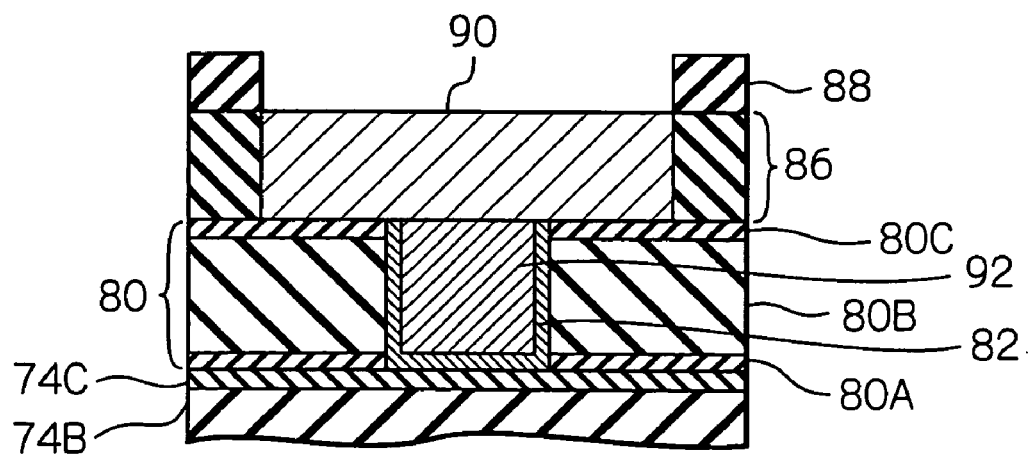
FIG. 2B is a cross-sectional view taken along the 2B—2B line of FIG. 2A.

FIG. 2A shows a part of an upper surface of a semiconductor device manufactured by the above-mentioned production method, and FIG. 2B shows a cross section taken along the 2B—2B line of FIG. 2A.

In these drawings, reference 90 indicates an electrode pad formed in the tenth or uppermost insulating interlayer structure 86, and reference 92 (FIG. 2B) indicates a part of the wiring layout pattern formed in the ninth insulating interlayer structure 80 and electrically connected to the electrode pad 90.

Also, in FIG. 2A, respective references $84_1$, $84_2$, $84_3$, $84_4$, $84_5$, $84_6$, $84_7$ and $84_8$ indicate reinforcing elements forming a part of the copper reinforcing pattern which is formed in the ninth insulating interlayer structure 80. The eight reinforcing elements $84_1$ to $84_8$ are represented by the reinforcing element 84 shown in FIG. 1Q. Namely, for example, when a cross-sectional view is taken along the line 1Q—1Q of FIG. 2A traversing the reinforcing element $84_6$, it corresponds to the cross-sectional view of FIG. 1Q.

As is apparent from FIGS. 1Q and 2A, since the eight reinforcing elements $84_1$, $84_2$, $84_3$, $84_4$, $84_5$, $84_6$, $84_7$ and $84_8$ (therefore, reinforcing columns) are arranged around the electrode pad 90, the low-k insulating layers 16B, 30B, 44B, 50B, 56B, 62B, 68B, 74B and 80B are physically and mechanically reinforced around the electrode pad 90. Although the electrode pad 90 is subjected to physical stresses when bonding and connecting either a gold wire or a metal bump to the electrode pad 90, it is possible to prevent production of cracks or peelings in the low-k insulating layers 16B, 30B, 44B, 50B, 56B, 62B, 68B, 74B and 80B.

Figure 3A:
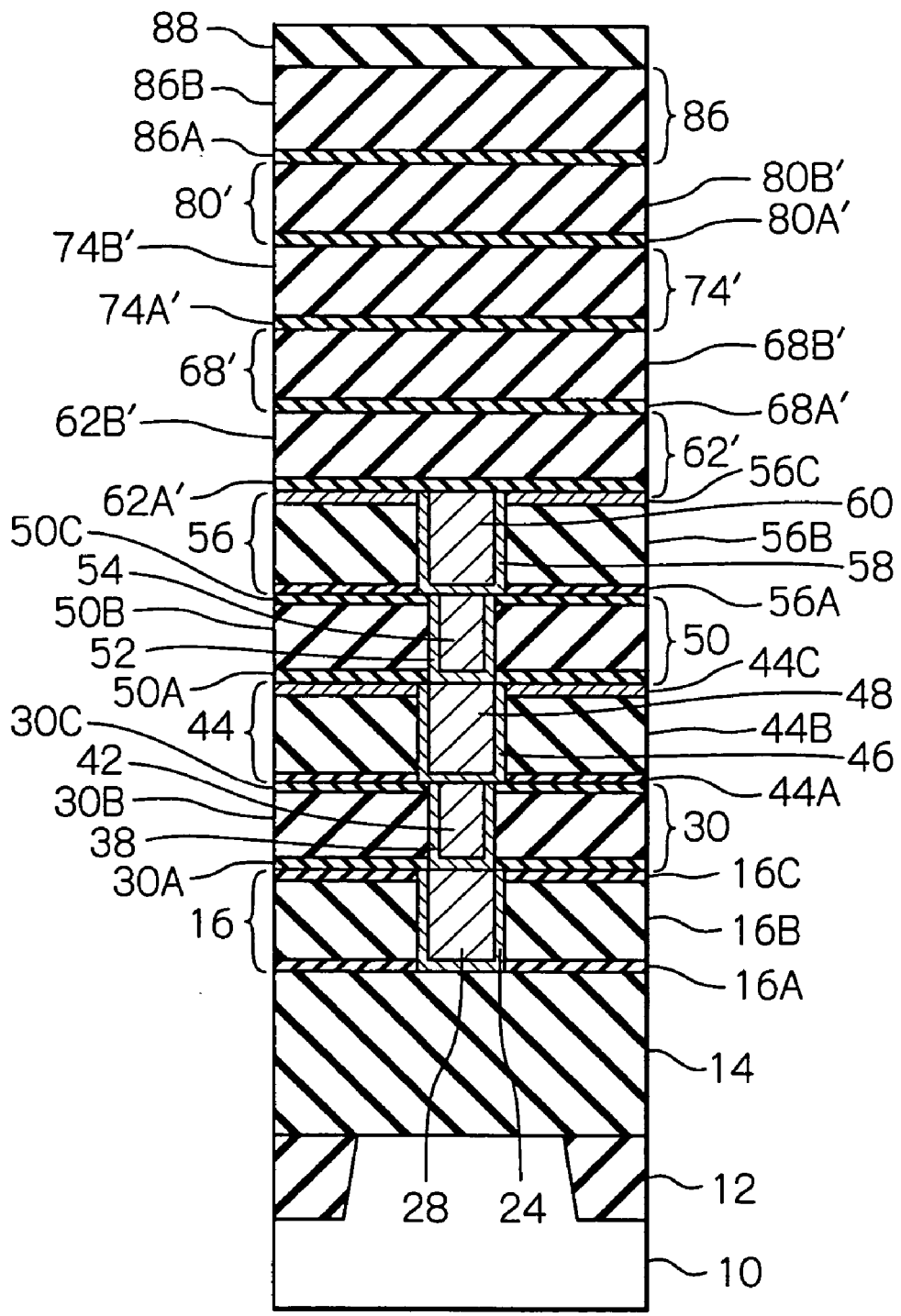
FIG. 3A is a partial cross-sectional view, similar to FIG. 1Q, showing a first modification of the first embodiment of the semiconductor device according to the present invention.

FIG. 3A shows a first modification of the first embodiment of the semiconductor device according to the present invention.

This first modification is substantially identical to the semiconductor device as shown in FIG. 1Q, except that sixth, seventh, eighth and ninth insulating interlayer structures 62', 68', 74' and 80' are substituted for the sixth, seventh, eighth and ninth insulating interlayer structures 62, 68, 74 and 80.

The sixth insulating interlayer structure 62' includes a metal-diffusion prevention layer 62A' formed on the fifth insulating interlayer structure 56, and a silicon dioxide layer 56B' formed on the metal-diffusion prevention layer 62A'. Although not visible in FIG. 3A, the silicon dioxide layer 56B' has copper via plugs formed therein by using a damascene process, and the copper via plugs are suitably connected to the wiring layout pattern (60) formed in the fifth insulating interlayer structure 56.

The seventh insulating interlayer structure 68' includes a metal-diffusion prevention layer 68A' formed on the sixth insulating interlayer structure 62', and a silicon dioxide layer 68B' formed on the metal-diffusion prevention layer 68A'. Although not visible in FIG. 3A, the silicon dioxide layer 68B' has a copper wiring layout pattern formed therein by using a damascene process, and the copper wiring layout pattern is suitably connected to the copper via plugs of the sixth insulating interlayer structure 62'.

The eighth insulating interlayer structure 74' includes a metal-diffusion prevention layer 74A' formed on the seventh insulating interlayer structure 68', and a silicon dioxide layer 74B' formed on the metal-diffusion prevention layer 74A'. Although not visible in FIG. 3A, the silicon dioxide layer 74B' has copper via plugs formed therein by using a damascene process, and the copper via plugs are suitably connected to the wiring layout pattern formed in the seventh insulating interlayer structure 68'.

The ninth insulating interlayer structure 80' includes a metal-diffusion prevention layer 80A' formed on the eighth insulating interlayer structure 74', and a silicon dioxide layer 80B' formed on the metal-diffusion prevention layer 80A'. Although not visible in FIG. 3A, the silicon dioxide layer 80B' has a copper wiring layout pattern formed therein by using a damascene process, and the copper wiring layout pattern is suitably connected to the copper via plugs of the eighth insulating interlayer structure 74'.

In general, in the multi-layered wiring arrangement, a wiring layout density in the upper side insulating interlayer structures is smaller in comparison with that in the lower side insulating interlayer structures. Thus, although the silicon dioxide layers 62B', 68B', 74B' and 80B' are used in the upper side insulating interlayer structures 62', 68', 74' and 80', it is possible to avoid the parasitic capacitance problem as stated hereinbefore.

Figure 3B:
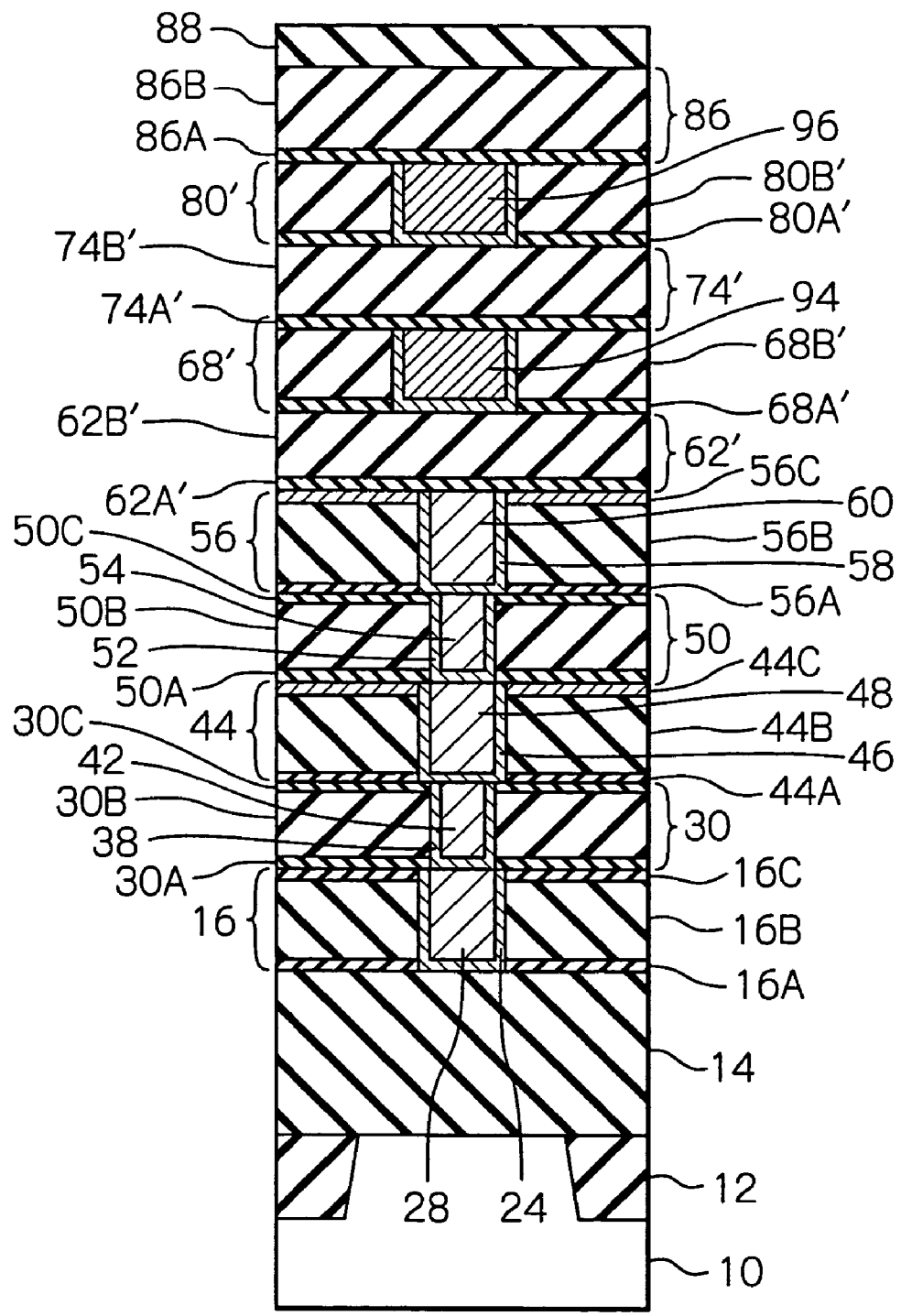
FIG. 3B is a partial cross-sectional view, similar to FIG. 1Q, showing a second modification of the first embodiment of the semiconductor device according to the present invention.

FIG. 3B shows a second modification of the first embodiment of the semiconductor device according to the present invention.

This second modification is substantially identical to the first modification shown in FIG. 3A, except that parts 94 and 96 of the wiring layout patterns formed in the respective seventh and ninth insulating interlayer structure 68' and 80' are positioned above the reinforcing column formed by alternately connecting the reinforcing elements 28, 48 and 60 and the joint plugs 42 and 54.

Figure 3C:
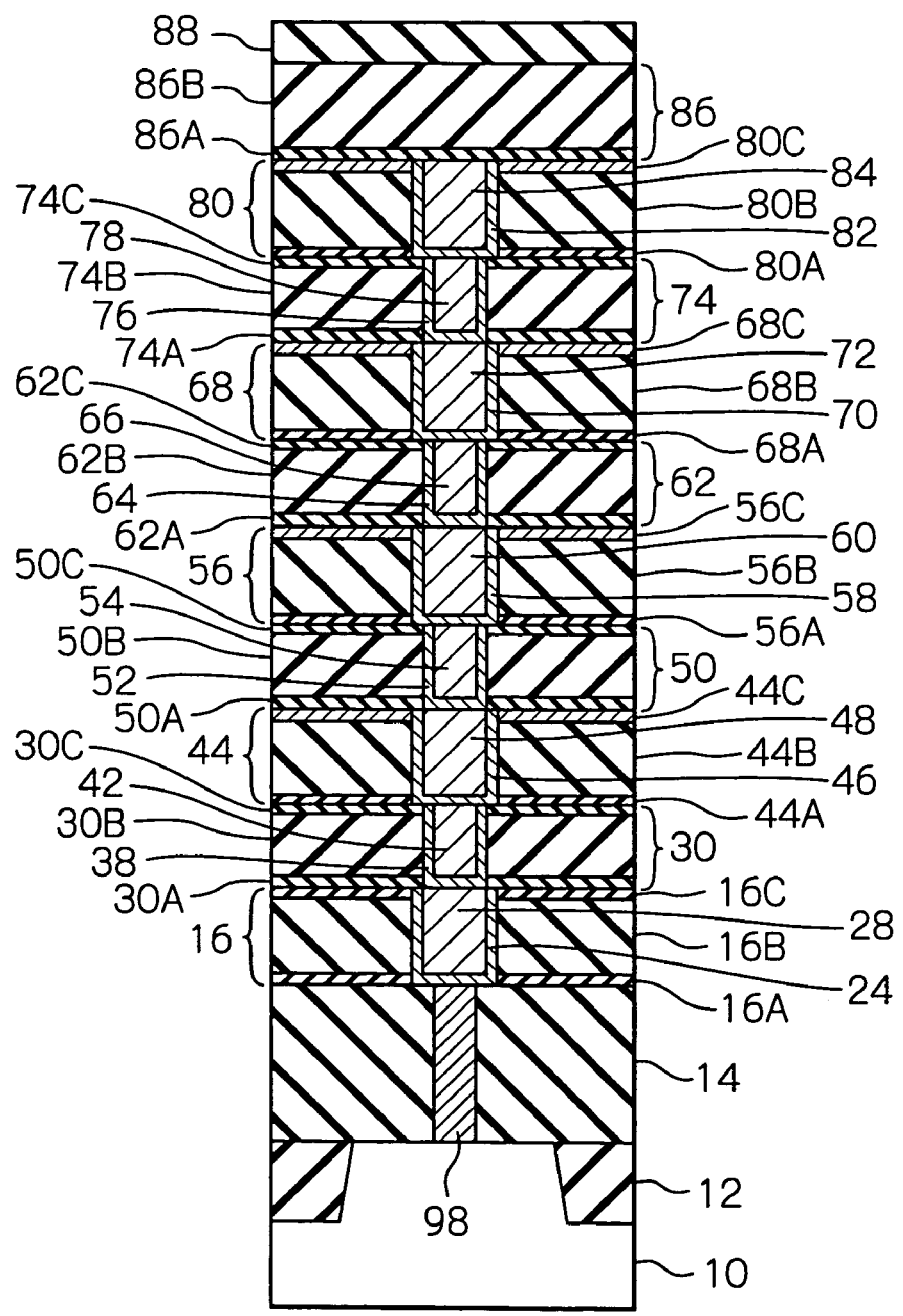
FIG. 3C is a partial cross-sectional view, similar to FIG. 1Q, showing a third modification of the first embodiment of the semiconductor device according to the present invention.

FIG. 3C shows a third modification of the first embodiment of the semiconductor device according to the present invention.

This third modification is substantially identical to the semiconductor device as shown in FIG. 1Q, except that a tungsten joint plug 98 is formed in the silicon dioxide layer or insulating underlayer 14 such that the reinforcing element 28 is connected to the semiconductor substrate 10 through the intermediary of the joint plug 98. Note, the joint plug 98 may be made of another suitable metal, such as copper (Cu) or the like.

In the above-mentioned embodiment, although the reinforcing pattern is used to physically and mechanically reinforce the low-k insulating layers 16B, 30B, 44B, 50B, 56B, 62B, 68B, 74B and 80B around the electrode pad 90, the reinforcing pattern can be arranged to entirely reinforce the low-k insulating layers 16B, 30B, 44B, 50B, 56B, 62B, 68B, 74B and 80B.

Figure 4A:
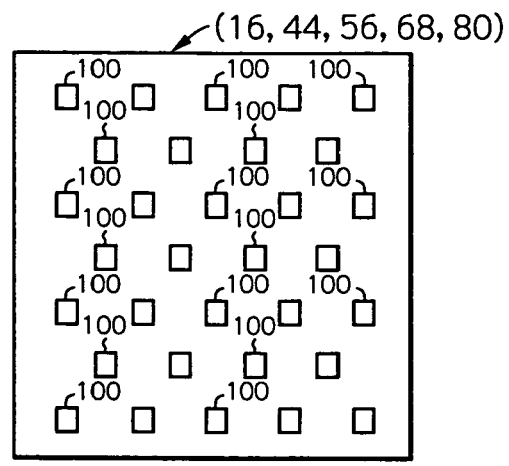
FIG. 4A is a plan view of an insulating interlayer structure in which a reinforcing pattern is formed.

For example, when a plurality of conductive paths forming the wiring layout pattern are entirely and uniformly distributed in one of the insulating interlayer structures 16, 44, 56, 68 and 80, it is possible to entirely and uniformly arrange a plurality of reinforcing elements forming the reinforcing pattern in the insulating interlayer structure concerned, as shown FIG. 4A by way of example, in which the wiring layout pattern is omitted to avoid complexity of illustration. Namely, as is apparent from FIG. 4A, the reinforcing elements (therefore, reinforcing columns), indicated by reference 100, forming the reinforcing pattern can be arranged without interfering with the wiring layout pattern (not shown), due to the uniform distribution of the conductive paths thereof. Thus, it is possible to entirely reinforce the low-k insulating layers 16B, 30B, 44B, 50B, 56B, 62B, 68B, 74B and 80B.

In FIG. 4A, for illustration, each of the reinforcing elements 100 has an exaggerated size in comparison with a chip size of the semiconductor device. In reality, a total area of the reinforcing elements 100 is at most 1% of a chip area of the semiconductor device. Also, a sum of the total area of the reinforcing elements 100 and the area of the wiring layout pattern (not shown) is from 10% to 90% of the chip area of the semiconductor device.

Note, in each of the insulating interlayer structures 30, 50, 62 and 74 in which the joint plugs (42, 54, 66, 78) and the via plugs are formed, a sum of the total area of the joint plugs and the total area of the via plugs is from 0.1% to 50% of the chip area of the semiconductor device.

Figure 4B:
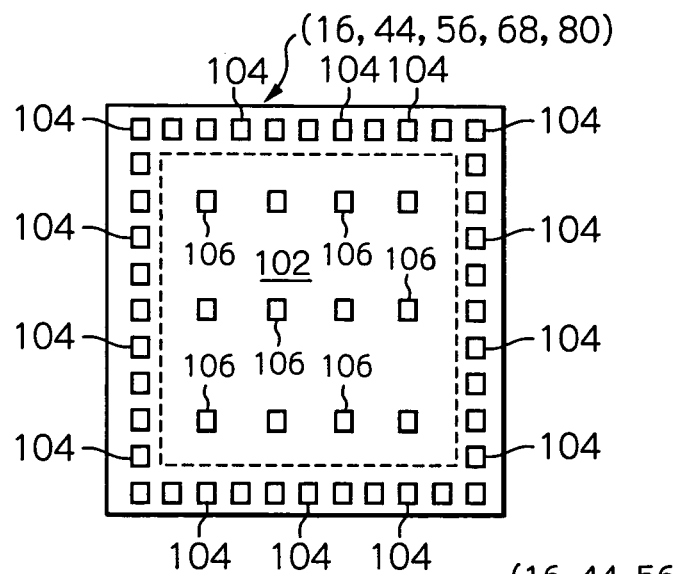
FIG. 4B is a plan view of an insulating interlayer structure in which another reinforcing pattern is formed.

Also, as shown in FIG. 4B by way of example, when the wiring layout pattern is distributed in a central rectangular area 102 (which is defined by broken lines) on one of the insulating interlayer structures 16, 44, 56, 68 and 80, it is possible to closely arrange a plurality of reinforcing elements 104 (therefore, reinforcing columns) forming the reinforcing pattern along the four sides of the insulating interlayer structure concerned, and some reinforcing elements 106 are sparsely arranged in the central rectangular area 102, whereby it is possible to entirely reinforce the low-k insulating layers 16B, 30B, 44B, 50B, 56B, 62B, 68B, 74B and 80B. Note, in FIG. 4B, the wiring layout pattern is omitted from the central rectangular area 102 to avoid complexity of illustration.

In FIG. 4B, it should be understood that the cracks or peeling are liable to occur in the four sides of the insulating interlayer structure if these sides are not reinforced by the reinforcing elements 104. Also, a width of the rectangular peripheral area, in which the reinforcing elements 104 are formed, is at most 10% of a side length of the chip area of the semiconductor device.

Figure 4C:
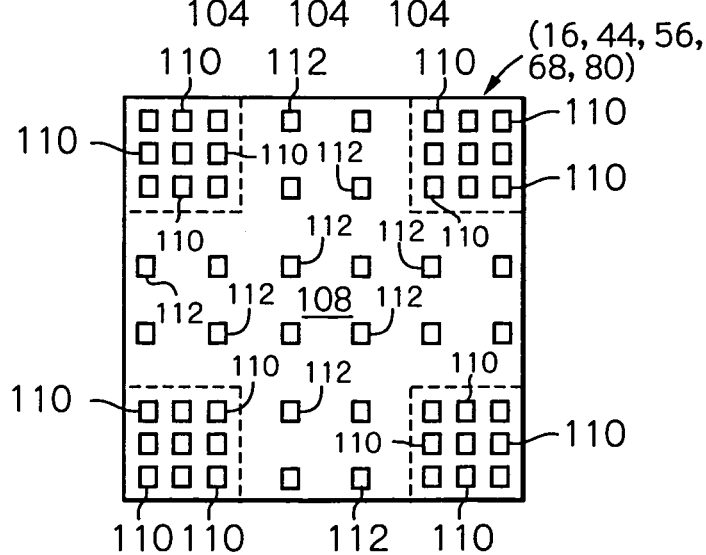
FIG. 4C is a plan view of an insulating interlayer structure in which yet another reinforcing pattern is formed.

Further, as shown in FIG. 4C, when the wiring layout pattern is distributed in a central cross area 108 (which is defined by broken lines) on one of the insulating interlayer structures 16, 44, 56, 68 and 80, it is possible to closely arrange a plurality of reinforcing elements 110 (therefore, reinforcing columns) forming the reinforcing pattern in the four corner areas of the insulating interlayer structure concerned, and some reinforcing elements 112 are sparsely arranged in the central cross area 108, whereby it is possible to entirely reinforce the low-k insulating layers 16B, 30B, 44B, 50B, 56B, 62B, 68B, 74B and 80B. Note, in FIG. 4C, the wiring layout pattern is omitted from the central cross area 108 to avoid complexity of illustration.

In FIG. 4C, if the corner areas of the insulating interlayer structure concerned are reinforced by the reinforcing elements 110, it should be understood that the cracks or peeling are liable to occur in the corner areas thereof.

FIG. 5 shows a second embodiment of the semiconductor device according to the present invention, and this semiconductor device may be manufactured in substantially the same production method as mentioned above.

In the second embodiment, the semiconductor device includes a semiconductor substrate 114, which is derived from a silicon wafer. The semiconductor substrate 114 has an element-isolation layer 116 formed therein. Although not visible in FIG. 5, various elements, such as transistors, resistors, capacitors and so on, are produced in areas surrounded by the element-isolation layer 116.

The semiconductor device also includes a silicon dioxide layer or insulating underlayer 118 formed on the semiconductor substrate 114, and the insulating underlayer 118 has a plurality of tungsten joint plugs formed therein and connected to the semiconductor substrate. Note, in FIG. 5, only one of the joint plugs is indicated by reference 120. Of course, although not visible in FIG. 5, the insulating underlayer 118 has a plurality of tungsten contact plugs which are suitably and electrically connected to various elements produced in the semiconductor substrate.

The semiconductor device further includes a multi-layered wiring arrangement, generally indicated by reference 122, which is constructed on the insulating underlayer 118. The multi-layered wiring arrangement 122 includes first, second, third, fourth, fifth, sixth, seventh, eighth, ninth and tenth insulating interlayer structures 124, 126, 128, 130, 132, 134, 136, 138, 140 and 142, which may be formed in order in substantially the same manner as mentioned above, using a damascene process.

The first or lowermost insulating interlayer structure 124 is composed of an etching stopper layer 124A formed on the underlayer 118, a low-k insulating layer 124B formed on the etching stopper layer 124A and having a copper reinforcing pattern and a copper wiring layout pattern formed therein, and a thin silicon dioxide layer 124C formed on the low-k insulating layer 124B. The reinforcing pattern includes a plurality of reinforcing elements, one of which is indicated by reference $124_1$, and the reinforcing element $124_1$ is connected to the joint plug 120. Also, a part of the wiring layout pattern is indicated by reference $124_2$.

The second insulating interlayer structure 126 is composed of a metal-diffusion prevention layer 126A formed on the first insulating interlayer structure 124, a low-k insulating layer 126B formed on the metal-diffusion prevention layer 126A and having a plurality of copper joint plugs and a plurality of copper via plugs formed therein, and a thin silicon dioxide layer 126C formed on the low-k insulating layer 126B. In FIG. 5, one of the joint plugs is indicated by reference $126_1$, and the joint plug $126_1$ is connected to the reinforcing element $124_1$ of the first insulating interlayer structure 124. Note, in FIG. 5, the via plugs formed in the low-k insulating layer 126B are not visible.

The third insulating interlayer structure 128 is composed of a metal-diffusion prevention layer 128A formed on the second insulating interlayer structure 126, a low-k insulating layer 128B formed on the metal-diffusion prevention layer 128A and having a copper reinforcing pattern and a copper wiring layout pattern formed therein, and a thin silicon dioxide layer 128C formed on the low-k insulating layer 128B. The reinforcing pattern includes a plurality of reinforcing elements, one of which is indicated by reference $128_1$, and the reinforcing element $128_1$ is connected to the joint plug $126_1$. Also, a part of the wiring layout pattern is indicated by reference $126_2$.

The fourth insulating interlayer structure 130 is composed of a metal-diffusion prevention layer 130A formed on the third insulating interlayer structure 128, a low-k insulating layer 130B formed on the metal-diffusion prevention layer 130A and having a plurality of copper joint plugs and a plurality of copper via plugs formed therein, and a thin silicon dioxide layer 130C formed on the low-k insulating layer 130B. In FIG. 5, one of the joint plugs is indicated by reference $130_1$, and the joint plug $130_1$ is connected to the reinforcing element $128_1$ of the third insulating interlayer structure 128. Note, in FIG. 5, the via plugs formed in the low-k insulating layer 130B are not visible.

The fifth insulating interlayer structure 132 is composed of a metal-diffusion prevention layer 132A formed on the fourth insulating interlayer structure 130, a low-k insulating layer 132B formed on the metal-diffusion prevention layer 132A and having a copper reinforcing pattern and a copper wiring layout pattern formed therein, and a thin silicon dioxide layer 132C formed on the low-k insulating layer 132B. The reinforcing pattern includes a plurality of reinforcing elements, one of which is indicated by reference $132_1$, and the reinforcing element $132_1$ is connected to the joint plug $130_1$. Also, a part of the wiring layout pattern is indicated by reference $132_2$.

The sixth insulating interlayer structure 134 is composed of a metal-diffusion prevention layer 134A formed on the fifth insulating interlayer structure 132, a low-k insulating layer 134B formed on the metal-diffusion prevention layer 134A and having a plurality of copper joint plugs and a plurality of copper via plugs formed therein, and a thin silicon dioxide layer 134C formed on the low-k insulating layer 134B. In FIG. 5, one of the joint plugs is indicated by reference $134_1$, and the joint plug $134_1$ is connected to the reinforcing element $132_1$ of the fifth insulating interlayer structure 132. Note, in FIG. 5, the via plugs formed in the low-k insulating layer 134B are not visible.

The seventh insulating interlayer structure 136 is composed of a metal-diffusion prevention layer 136A formed on the sixth insulating interlayer structure 134, a low-k insulating layer 136B formed on the metal-diffusion prevention layer 136A and having a copper reinforcing pattern and a copper wiring layout pattern formed therein, and a thin silicon dioxide layer 136C formed on the low-k insulating layer 136B. The reinforcing pattern includes a plurality of reinforcing elements, one of which is indicated by reference $136_1$. In this embodiment, the reinforcing element $136_1$ is formed as an elongated reinforcing element for the reasons stated hereinafter, and one end of the elongated reinforcing element is connected to the joint plug $134_1$ of the sixth insulating interlayer structure 134. Note, in FIG. 5, the wiring layout pattern formed in the low-k insulating layer 136B is not visible.

The eighth insulating interlayer structure 138 is composed of a metal-diffusion prevention layer 138A formed on the seventh insulating interlayer structure 136, a low-k insulating layer 138B formed on the metal-diffusion prevention layer 138A and having a plurality of copper joint plugs and a plurality of copper via plugs formed therein, and a thin silicon dioxide layer 138C formed on the low-k insulating layer 138B. In FIG. 5, one of the joint plugs is indicated by reference $138_1$, and the joint plug $138_1$ is connected to the other end of the elongated reinforcing element $136_1$ of the seventh insulating interlayer structure 136. In short, although the joint plug $138_1$ is in non-alignment with the joint plug $134_1$, it is possible to connect the joint plugs $134_1$ and $138_1$ to each other by using the elongated reinforcing element $136_1$. Note, in FIG. 5, the via plugs formed in the low-k insulating layer $138B$ are not visible.

The ninth insulating interlayer structure 140 is composed of a metal-diffusion prevention layer 140A formed on the eighth insulating interlayer structure 138, a low-k insulating layer 140B formed on the metal-diffusion prevention layer 140A and having a copper reinforcing pattern and a copper wiring layout pattern formed therein, and a thin silicon dioxide layer 140C formed on the low-k insulating layer 140B. The reinforcing pattern includes a plurality of reinforcing elements, one of which is indicated by reference $140_1$, and the reinforcing element $140_1$ is connected to the joint plug $138_1$ of the eighth insulating interlayer structure 138. Also, in FIG. 5, a part of the wiring layout pattern is indicated by reference $140_2$, and this part $140_2$ is positioned above the joint plug $134_1$ of the sixth insulating interlayer structure 134.

The tenth or uppermost insulating interlayer structure 142 is composed of a metal-diffusion prevention layer 142A formed on the ninth insulating interlayer structure 140, and a silicon dioxide layer 142B formed on the metal-diffusion prevention layer 142A. The uppermost insulating interlayer structure 142 has a plurality of electrode pads (not visible in FIG. 5) formed therein, and these electrode pads are suitably and electrically connected to the wiring layout pattern formed in the ninth insulating interlayer structure 140. Note, each of the electrode pads may be made of a suitable metal material, such as a nickel/copper alloy, a titanium/tungsten alloy or the like.

The multi-layered wiring arrangement 122 further includes a passivation layer 144 which is formed as a protective layer on the uppermost insulating interlayer structure 142, and is perforated such that the electrode pads are exposed to the outside.

Similar to the aforesaid first embodiment of the semiconductor device, the reinforcing elements $124_1$, $128_1$, $132_1$, $136_1$ and $140_1$ and the joint plugs $126_2$, $130_2$, $134_2$ and $138_2$ are alternately connected to each other to thereby define a reinforcing column extending through the insulating interlayer structures 124, 126, 128, 130, 132, 134, 136, 138 and 140, but the reinforcing column cannot be extended straight, because of the interference with the part $140_2$ of the wiring layout pattern formed in the insulating interlayer structure 140. For this reason, in the second embodiment, the reinforcing column is extended so as to be bypassed around the part $140_2$ of the wiring layout pattern by using the elongated reinforcing element $136_1$. In short, when a formation of a reinforcing column interferes with a part of a wiring layout pattern, it is possible to dissolve the interference by using an elongated reinforcing element ($136_1$).

Figure 6A:
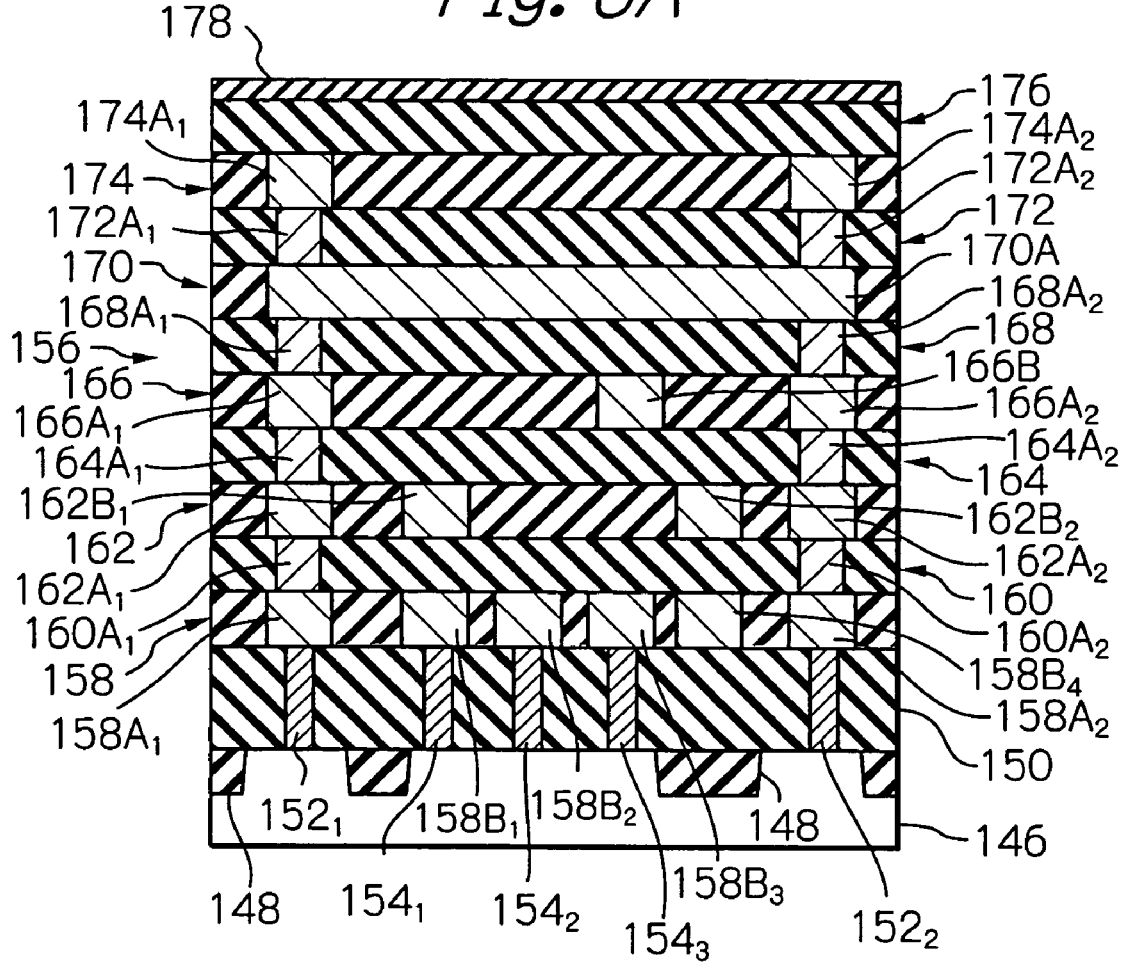
FIG. 6A is a cross-sectional view taken along the 6A—6A line of FIG. 6B, showing a third embodiment of the semiconductor device according to the present invention.

FIG. 6A shows a third embodiment of the semiconductor device according to the present invention, and this semiconductor device may be manufactured by substantially the same production method as mentioned above.

In this third embodiment, the semiconductor device includes a semiconductor substrate 146, which is derived from a silicon wafer. The semiconductor substrate 146 has an element-isolation layer 148 formed therein. Although not visible in FIG. 6A, various elements, such as transistors, resistors, capacitors and so on, are produced in areas surrounded by the element-isolation layer 148.

The semiconductor device also includes a silicon dioxide layer or insulating underlayer 150 formed on the semiconductor substrate 146, and the insulating underlayers 150 includes a plurality of tungsten joint plugs, and a plurality of tungsten contact plugs formed therein. In FIG. 6A, two of the joint plugs are indicated by references $152_1$ and $152_2$, and three of the contact plugs are indicated by references $154_1$, $154_2$ and $154_3$. The joint plugs $152_1$ and $152_2$ are connected to the semiconductor substrate 146, and the contact plugs $154_1$, $154_2$ and $154_3$ are suitably and electrically connected to the various elements produced in the semiconductor substrate 146.

The semiconductor device further includes a multi-layered wiring arrangement, generally indicated by reference 156, which is constructed on the insulating underlayer 150. The multi-layered wiring arrangement 156 includes first, second, third, fourth, fifth, sixth, seventh, eighth, ninth and tenth insulating interlayer structures 158, 160, 162, 164, 166, 168, 170, 172, 174 and 176, which may be formed in order in substantially the same manner as mentioned above, using a damascene process.

Note, although each of the first to ninth insulating interlayer structures 158, 160, 162, 164, 166, 168, 170, 172 and 174 is composed of an etching stopper layer or metal-diffusion prevention layer, a low-k insulating layer formed on the metal-diffusion prevention layer, and a thin silicon dioxide layer formed on the low-k insulating layer, the metal-diffusion prevention layer and the thin silicon dioxide layer are omitted to avoid complexity of illustration.

The first insulating interlayer 158 has a copper reinforcing pattern and a copper wiring layout pattern formed therein. The reinforcing pattern includes a plurality of reinforcing elements, two of which are indicated by references $158A_1$ and $158A_2$, and the respective reinforcing elements $158A_1$ and $158A_2$ are connected to the joint plugs $152_1$ and $152_2$ formed in the insulating underlayer 150. Also, four parts of the wiring layout pattern are indicated by references $158B_1$, $158B_2$, $158B_3$ and $158B_4$, and the respective parts $158B_1$, $158B_2$ and $158B_3$ are electrically connected to the contact plugs contact plugs $154_1$, $154_2$ and $154_3$.

The second insulating interlayer structure 160 has a plurality of copper joint plugs and a plurality of copper via plugs formed therein. Two of the joint plugs are indicated by references $160A_1$ and $160A_2$, and the respective joint plugs $160A_1$ and $160A_2$ are connected to the reinforcing elements $158A_1$ and $158A_2$ formed in the first insulating interlayer structure 158. Note, in FIG. 6A, the via plugs formed in the second insulating interlayer structure 160 are not visible.

The third insulating interlayer 162 has a copper reinforcing pattern and a copper wiring layout pattern formed therein. The reinforcing pattern includes a plurality of reinforcing elements, two of which are indicated by references $162A_1$ and $162A_2$, and the respective reinforcing elements $162A_1$ and $162A_2$ are connected to the joint plugs $160A_1$ and $160A_2$ formed in the second insulating interlayer structure 160. Note, in FIG. 6A, two parts of the wiring layout pattern are indicated by references $162B_1$ and $162B_2$.

The fourth insulating interlayer structure 164 has a plurality of copper joint plugs and a plurality of copper via plugs formed therein. Two of the joint plugs are indicated by references $164A_1$ and $164A_2$, and the respective joint plugs $164A_1$ and $164A_2$ are connected to the reinforcing elements $164A_1$ and $164A_2$ formed in the third insulating interlayer structure 162. Note, in FIG. 6A, the via plugs formed in the fourth insulating interlayer structure 164 are not visible.

The fifth insulating interlayer 166 has a copper reinforcing pattern and a copper wiring layout pattern formed therein. The reinforcing pattern includes a plurality of reinforcing elements, two of which are indicated by reference 166A$_1$ and 166A$_2$, and the respective reinforcing elements 166A$_1$ and 166A$_2$ are connected to the joint plugs 164A$_1$ and 164A$_2$ formed in the fourth insulating interlayer structure 164. Note, in FIG. 6A, a part of the wiring layout pattern is indicated by reference 166B.

The sixth insulating interlayer structure 168 has a plurality of copper joint plugs and a plurality of copper via plugs formed therein. Two of the joint plugs are indicated by references 168A$_1$ and 168A$_2$, and the respective joint plugs 168A$_1$ and 168A$_2$ are connected to the reinforcing elements 166A$_1$ and 166A$_2$ formed in the fifth insulating interlayer structure 166. Note, in FIG. 6A, the via plugs formed in the sixth insulating interlayer structure 168 are not visible.

The seventh insulating interlayer 170 has a copper reinforcing pattern and a copper wiring layout pattern formed therein. The reinforcing pattern includes a plurality of reinforcing elements, one of which is indicated by reference 170. In this embodiment, the reinforcing element 170 is formed as a beam-like reinforcing element. The respective ends of the beam-like reinforcing element 170A are connected to the joint plugs 168A$_1$ and 168A$_2$ formed in the sixth insulating interlayer structure 168. Note, in FIG. 6A, the via plugs formed in the seventh insulating interlayer structure 170 are not visible.

The eighth insulating interlayer structure 172 has a plurality of copper joint plugs and a plurality of copper via plugs formed therein. Two of the joint plugs are indicated by references 172A$_1$ and 172A$_2$, and the respective joint plugs 172A$_1$ and 172A$_2$ are connected to the ends of the beam-like reinforcing element 170A formed in the seventh insulating interlayer structure 170. Note, in FIG. 6A, the via plugs formed in the eighth insulating interlayer structure 172 are not visible.

The ninth insulating interlayer 174 has a copper reinforcing pattern and a copper wiring layout pattern formed therein. The reinforcing pattern includes a plurality of reinforcing elements, two of which are indicated by references 174A$_1$ and 174A$_2$, and respective reinforcing elements 174A$_1$ and 174A$_2$ are connected to the joint plugs 172A$_1$ and 172A$_2$ formed in the eighth insulating interlayer structure 172. Note, in FIG. 6A, the via plugs formed in the ninth insulating interlayer structure 174 are not visible.

The tenth or uppermost insulating interlayer structure 176 is composed of a metal-diffusion prevention layer formed on the ninth insulating interlayer structure 174, and a silicon dioxide layer formed on the metal-diffusion prevention layer. Note, in FIG. 6A, the metal-diffusion prevention layer is omitted to avoid complexity of illustration. The uppermost insulating interlayer structure 176 has a plurality of electrode pads (not visible in FIG. 6A) formed therein, and these electrode pads are suitably and electrically connected to the wiring layout pattern formed in the ninth insulating interlayer structure 176. Note, each of the electrode pads may be made of a suitable metal material, such as a nickel/copper alloy, a titanium/tungsten alloy or the like.

The multi-layered wiring arrangement 156 further includes a passivation layer 178 which is formed as a protective layer on the uppermost insulating interlayer structure 176, and is perforated such that the electrode pads are exposed to the outside.

In this third embodiment of the semiconductor device, the reinforcing elements 158A$_1$, 162A$_1$, 166A$_1$, 170A and 174A$_1$ and the reinforcing-plugs 126A$_1$, 130A$_1$, 134A$_1$, and 138A$_1$, are alternately connected to each other to thereby define a first reinforcing column extending through the insulating interlayer structures 158, 160, 162, 164, 166, 168, 170, 172 and 174, and the reinforcing elements 158A$_2$, 162A$_2$, 166A$_2$, 170A and 174A$_2$ and the reinforcing-plugs 126A$_2$, 130A$_2$, 134A$_2$ and 138A$_2$ are alternately connected to each other to thereby define a second reinforcing column extending through the insulating interlayer structures 158, 160, 162, 164, 166, 168, 170, 172 and 174. Namely, the third embodiment is characterized in that the first and second reinforcing columns are connected to each other by the beam-like reinforcing elements 170A.

Figure 6B:
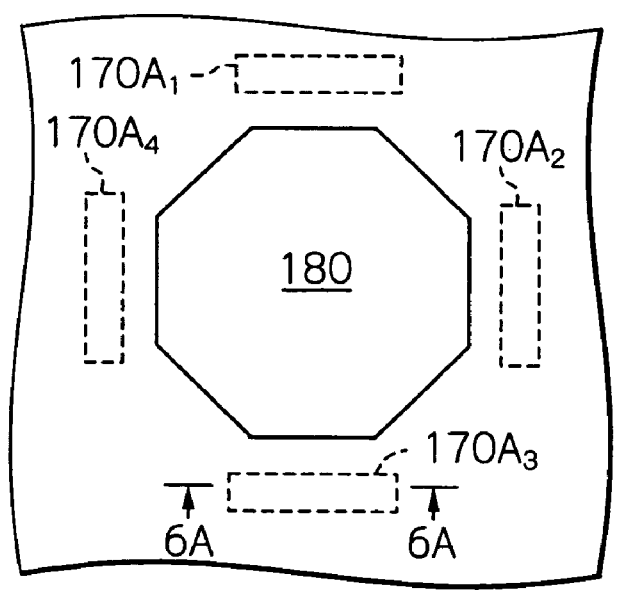
FIG. 6B is a plan view showing a part of an upper surface of shown in FIG. 6A.

In FIG. 6B in which a part of an upper surface of the semiconductor device shown in FIG. 6A is shown, reference 180 indicates an electrode pad formed in the tenth or uppermost insulating interlayer structure 86, and respective references 170A$_1$, 170A$_2$, 170A$_3$ and 170A$_4$ indicate beam-like reinforcing elements forming a part of the copper reinforcing pattern which is formed in the seventh insulating interlayer structure 170. The four reinforcing elements 170A$_1$ to 170A$_4$ are represented by the beam-like reinforcing element 170A shown in FIG. 6A. Namely, for example, when a cross-sectional view is taken along the line 6A—6A of FIG. 6B traversing the beam-like reinforcing element 170A$_3$, it corresponds to the cross-sectional view of FIG. 6A.

As is apparent from FIGS. 6A and 6B, since the four respective sets of first and second reinforcing columns connected to each other by the beam-like reinforcing elements 170A$_1$, 170A$_2$, 170A$_3$ and 170A$_4$ are arranged around the electrode pad 180, the insulating interlayer structures (low-k layers) 158, 160, 162, 164, 166, 168, 170, 172 and 174 are physically and mechanically reinforced around the electrode pad 180. Thus, although the electrode pad 180 is subjected to physical stresses when bonding and connecting either a gold wire or a metal bump to the electrode pad 180, it is possible to prevent occurrence of cracks or peeling in the insulating interlayer structures (low-k layers) 158, 160, 162, 164, 166, 168, 170, 172 and 174.

FIGS. 7A and 7B show a fourth embodiment of the semiconductor device according to the present invention, and this semiconductor device may be manufactured in substantially the same manner as mentioned above. Note, in FIG. 7A, the semiconductor device is illustrated in a plan view, and, in FIG. 7B, the semiconductor device is illustrated in a cross section taken along the 7B—7B line of FIG. 7A.

In the forth embodiment, the semiconductor device includes a semiconductor substrate 182, which is derived form a silicon wafer, and the semiconductor substrate 182 has an element-isolation layer 184 formed therein. Although not visible in FIG. 7B, various elements, such as transistors, resistors, capacitors and so on, are produced in areas surrounded by the element-isolation layer 184.

The semiconductor device also includes a silicon dioxide layer or insulating underlayer 186 formed on the semiconductor substrate 182, and the insulating underlayer 186 has a rectangular frame-like joint plug 187 formed therein and connected to the semiconductor substrate 182. The rectangular frame-like joint plug 187 is made of a suitable metal material, such as tungsten (W) or the like, and has a contour C1 shown by broken lines in FIG. 7A. Note, although the insulating underlayer 186 has a plurality of contact plugs formed therein and contacted to the various elements produced in the semiconductor substrate 182, these contact plugs are not visible in FIG. 7B.

The semiconductor device further includes a multi-layered wiring arrangement, generally indicated by reference 188, constructed on the insulating underlayer 186. The multi-layered wiring arrangement 188 includes first second, third, fourth, fifth, sixth, seventh, eighth, ninth and tenth insulating interlayer structures 190, 192, 194, 196, 198, 200, 202, 204, 206 and 208, which may be formed in order in substantially the same manner as mentioned above, using a damascene process.

Note, although each of the first to ninth insulating interlayer structures 190, 192, 194, 196, 198, 200, 202, 204 and 206 is composed of an etching stopper layer or metal-diffusion prevention layer, a low-k insulating layer formed on the metal-diffusion prevention layer, and a thin silicon dioxide layer formed on the low-k insulating layer, the metal-diffusion prevention layer and the thin silicon dioxide layer are omitted to avoid complexity of illustration.

The first or lowermost insulating interlayer structure 190 has a rectangular frame-like copper reinforcing element 190A and a copper wiring layout pattern (not visible) formed therein. The frame-like copper reinforcing element 190A has a contour C2 shown by broken lines in FIG. 7A, and is connected to the frame-like joint plug 187 formed in the insulating underlayer 186. As is apparent from FIG. 7A, the frame-like copper reinforcing element 190A is thicker than the frame-like reinforcing element 187.

The second insulating interlayer structure 192 has a rectangular frame-like copper joint plug 192A and a plurality of copper via plugs (not visible) formed therein. The frame-like copper joint plug 190A has the contour C1 shown by the broken lines in FIG. 7A, and is connected to the frame-like copper reinforcing element 190A formed in the first insulating interlayer structure 190.

The third insulating interlayer structure. 194 has a rectangular frame-like copper reinforcing element 194A and a copper wiring layout pattern (not visible) formed therein. The frame-like copper reinforcing element 190A has the contour C2 shown by the broken lines in FIG. 7A, and is connected to the frame-like copper joint plug 190A formed in the second insulating interlayer structure 190.

The fourth insulating interlayer structure 196 has a rectangular frame-like copper joint plug 196A and a plurality of copper via plugs (not visible) formed therein. The frame-like copper joint plug 196A has the contour C1 shown by the broken lines in FIG. 7A, and is connected to the frame-like copper reinforcing element 194A formed in the third insulating interlayer structure 194.

The fifth insulating interlayer structure 198 has a rectangular frame-like copper reinforcing element 198A and a copper wiring layout pattern (not visible) formed therein. The frame-like copper reinforcing element 198A has the contour C2 shown by the broken lines in FIG. 7A, and is connected to the frame-like copper joint plug 196A formed in the fourth insulating interlayer structure 190.

The sixth insulating interlayer structure 200 has a rectangular frame-like copper joint plug 200A and a plurality of copper via plugs (not visible) formed therein. The frame-like copper joint plug 200A has the contour C1 shown by the broken lines in FIG. 7A, and is connected to the frame-like copper reinforcing element 198A formed in the fifth insulating interlayer structure 198.

The seventh insulating interlayer structure 202 has a rectangular frame-like copper reinforcing element 202A and a copper wiring layout pattern (not visible) formed therein. The frame-like copper reinforcing element 200A has the contour C2 shown by the broken lines in FIG. 7A, and is connected to the frame-like copper joint plug 200A formed in the sixth insulating interlayer structure 200.

The eighth insulating interlayer structure 204 has a rectangular frame-like copper joint plug 204A and a plurality of copper via plugs (not visible) formed therein. The frame-like copper joint plug 204A has the contour C1 shown by the broken lines in FIG. 7A, and is connected to the frame-like copper reinforcing element 202A formed in the seventh insulating interlayer structure 202.

The ninth insulating interlayer structure 206 has a rectangular frame-like copper reinforcing element 206A and a copper wiring layout pattern (not visible) formed therein. The frame-like copper reinforcing element 206A has the contour C2 shown by the broken lines in FIG. 7A, and is connected to the frame-like copper joint plug 204A formed in the eighth insulating interlayer structure 204.

The tenth or uppermost insulating interlayer structure 208 is composed of a metal-diffusion prevention layer formed on the ninth insulating interlayer structure 206, and a silicon dioxide layer formed on the metal-diffusion prevention layer. Note, in FIG. 7B, the metal-diffusion prevention layer is omitted to avoid complexity of illustration. The uppermost insulating interlayer structure 208 has a plurality of electrode pads (not visible in FIG. 6A) formed therein, and these electrode pads are suitably and electrically connected to the wiring layout pattern formed in the ninth insulating interlayer structure 206. Note, each of the electrode pads may be made of a suitable metal material, such as a nickel/copper alloy, a titanium/tungsten alloy or the like.

The multi-layered wiring arrangement 188 further includes a passivation layer 209 which is formed as a protective layer on the uppermost insulating interlayer structure 176, and is perforated such that the electrode pads are exposed to the outside.

As is apparent from FIGS. 7A and 7B, in the fourth embodiment, the frame-like copper reinforcing elements 190A, 194A, 198A, 202A and 206A and the frame-like copper joint plugs 192A, 196A, 200A and 204A are alternately connected to each other so as to define a peripheral rectangular reinforcing wall extending through the insulating interlayer structures 190, 192, 194, 196, 198, 200, 202, 204 and 206, whereby the insulating interlayer structures (low-k layers) 190, 192, 194, 196, 198, 200, 202, 204 and 206 are physically and mechanically anchored to each other by the peripheral rectangular reinforcing wall, resulting in physical and mechanical reinforcement of the insulating interlayer structures (low-k layers) 190, 192, 194, 196, 198, 200, 202, 204 and 206 along the peripheral four sides thereof.

Note, in this embodiment, the multi-layered wiring arrangement 188 may include a plurality of reinforcing columns (as shown in FIG. 1Q) in the interior surrounded by the peripheral rectangular reinforcing wall.

In the fourth embodiment of the semiconductor device according to the present invention, a thermal cycle test was carried out. For this thermal cycle test, a first group of semiconductor devices A manufactured according to the present invention and a second group of semiconductor devices B not reinforced according to the present invention were prepared. In each of the semiconductor devices A, a multi-layered wiring arrangement was formed as a five-layered wiring arrangement including first, second, third, fourth and fifth insulating interlayer structures. A wiring layout pattern of the fifth insulating interlayer structure was electrically connected to a wiring layout pattern of the third insulating interlayer structure through via plugs of the fourth insulating interlayer structure, the wiring layout pattern of the third insulating interlayer structure was electrically connected to the first insulating interlayer structure through via plugs of the second insulating interlayer structure, and the wiring layout pattern of the first insulating interlayer structure was electrically connected to a semiconductor substrate through contact plugs of an insulating underlayer. This is also true for the semiconductor devices B.

The first and second groups were subjected to a cycle of predetermined thermal variations by alternately exposing them to an atmosphere of −40° C. during a time period of 30 min. and an atmosphere of +120° C. during a time period of 30 min. Thereafter, in each of the semiconductor devices A and B, a voltage was applied between the semiconductor substrate and the wiring layout pattern of the fifth insulating interlayer structure. If a current did not flow between the semiconductor substrate and the wiring layout pattern of the fifth insulating interlayer structure, the semiconductor device concerned was removed as a bad product from the corresponding group.

Subsequently, the remaining semiconductor devices A and B were further subjected to a cycle of predetermined thermal variations by alternately exposing them to an atmosphere of −40° C. during a time period of 30 min. and an atmosphere of +120° C. during a time period of 30 min. Thereafter, in each of the semiconductor devices A and B, a voltage was again applied between the semiconductor substrate and the wiring layout pattern of the fifth insulating interlayer structure. If a current did not flow between the semiconductor substrate and the wiring layout pattern of the fifth insulating interlayer structure, the semiconductor device concerned was removed as a bad product from the corresponding group.

With respect to each of the first and second groups, this procedure was repeated until a percentage of the bad products has reached a predetermined value. Then, the number of the cycles to which the first group was subjected, was compared with the number of the cycles to which the second group was subjected.

As a result of the test, it was determined that the number of cycles of the first group is three times larger than that of the second group. Namely, it was found that the first group of semiconductor devices A was three times stronger than the second group of semiconductor devices B with respect to the thermal stresses.

With reference to FIGS. 8A to 8L, a first embodiment of the production method according to the present invention will be now explained below.

Figure 8A:
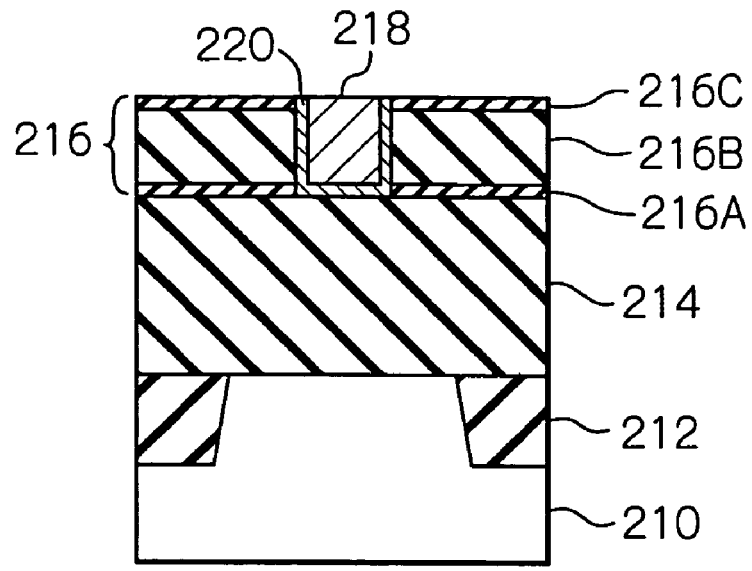
FIG. 8A is a partial cross-sectional view of a silicon wafer, showing a first representative step of a second embodiment of the production method according to the present invention.

First, referring to FIG. 8A, a part of a semiconductor substrate 210, defining a semiconductor chip area on a silicon wafer, is illustrated in a vertical cross-sectional view. As shown in this drawing, an element-isolation layer 212 is formed in the semiconductor substrate 210. Note, although not visible in FIG. 8A, various elements, such as transistors, resistors, capacitors and so on, are produced in areas surrounded by the element-isolation layer 212.

After the production of the various elements is completed, a silicon dioxide layer 214 is formed as an insulating underlayer on the surface of the silicon wafer. Although not visible in FIG. 8A, contact plugs are formed in the insulating underlayer.214, and each of the contact plugs is electrically connected to a corresponding element produced in the semiconductor substrate 210. Note, in this embodiment, the contact plugs are made of tungsten (W).

After the formation of the contact plugs is completed, a multi-layered wiring arrangement including at least three insulating interlayer structures is constructed on the insulating underlayer 214, using a dual damascene process.

In particular, as shown in FIG. 1A, a lowermost or first insulating interlayer structure 216 is formed on the insulating underlayer 214. In this embodiment, the first insulating interlayer structure 216 is composed of an etching stopper layer 216A formed on the insulating underlayer 214, a low-k insulating layer 216B formed on the etching stopper layer 216A, and a thin protective layer 216C formed on the low-k insulating layer 216B.

Similarly to the aforesaid first embodiment of the production method, the etching stopper layer 216A is made of silicon nitride (SiN), SiCN, or the like, and the formation of the etching stopper layer 216A may be carried out, using a suitable chemical vapor deposition (CVD) process.

Also, the low-k insulating layer 216B is made of SiOCH, and the formation of the low-k insulating layer 16B may be carried out, using either a suitable CVD process or a coating/baking process. Similarly to the aforesaid first embodiment of the production method, the low-k insulating layer 216B may be made of another low-k material, such as, L-Ox (Registered Trademark: ladder hydrogenated siloxane), SiOC, SiOF, HSQ (hydrogen-silsesquioxane), MSQ (methyl-silsesquioxane) or the like.

The thin protective layer 216C may be composed of silicon dioxide, and the formation of the thin protective layer 216C may be carried out, using a suitable CVD process. Note, the thin protective layer 216C is provided for the aforesaid reason as stated above.

After the formation of the first insulating interlayer structure 216, a copper reinforcing pattern and a copper wiring layout pattern are formed in the first insulating interlayer structure 216 for a semiconductor chip area on the silicon wafer, in substantially the same manner as explained referring to FIGS. 1B to 1G. The copper reinforcing pattern includes a plurality of reinforcing elements, one of which is indicated by reference 218. Note, in FIG. 8A, reference 220 indicates a barrier metal layer. Also, note, the wiring layout pattern is not visible in FIG. 8A.

Figure 8B:
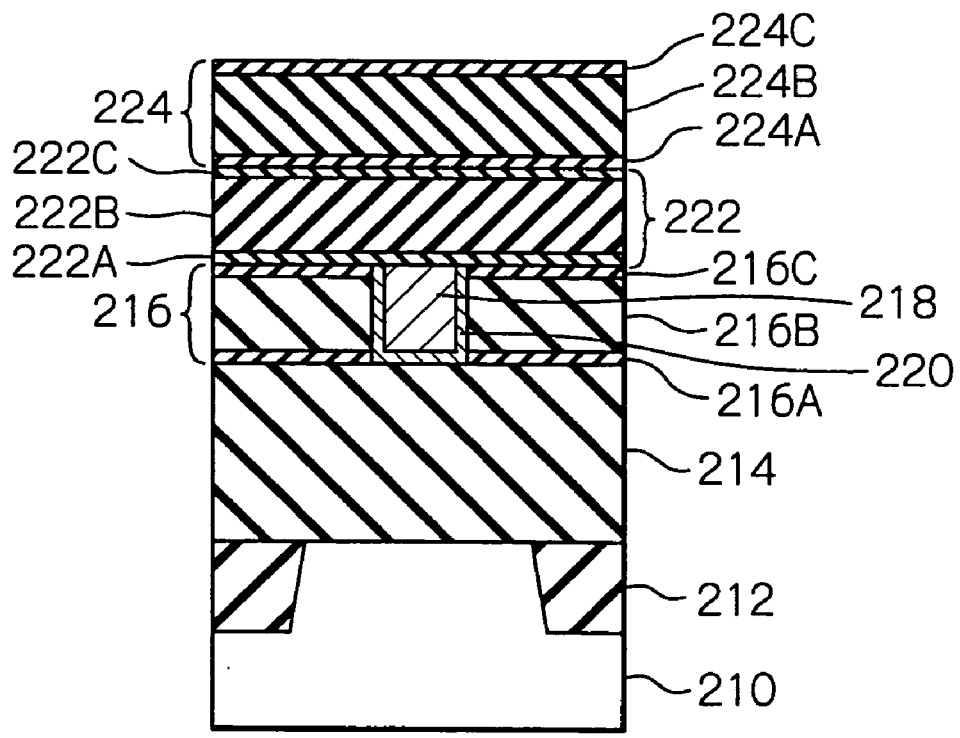
FIG. 8B is a partial cross-sectional view, similar to FIG. 8A, showing a second representative step of the second embodiment of the production process according to the present invention.

After the formation of the reinforcing pattern and wiring layout pattern in the first insulating interlayer structure 216, as shown in FIG. 8B, second and third insulating interlayer structures 222 and 224 are formed in order on the first insulating interlayer structure 216. The second insulating interlayer structure 222 is composed of an etching stopper layer or metal-diffusion prevention layer 222A on the first insulating interlayer structure 216, a low-k insulating layer 222B formed on the etching stopper layer 222A, and a thin protective layer 222C formed on the low-k insulating layer 222B. The third insulating interlayer structure 224 is composed of an etching stopper layer or metal-diffusion prevention layer 224A on the second insulating interlayer structure 222, a low-k insulating layer 222B formed on the etching stopper layer 224A, and a thin protective layer 224C formed on the low-k insulating layer 224B. Note, the etching stopper layer 30A also serves as a metal-diffusion prevention layer, by which copper is prevented from being diffused from both the copper wiring layout patterns and the copper reinforcing patterns (28) of the first insulating interlayer structure 16 into the low-k insulating layer 30B.

Figure 8C:
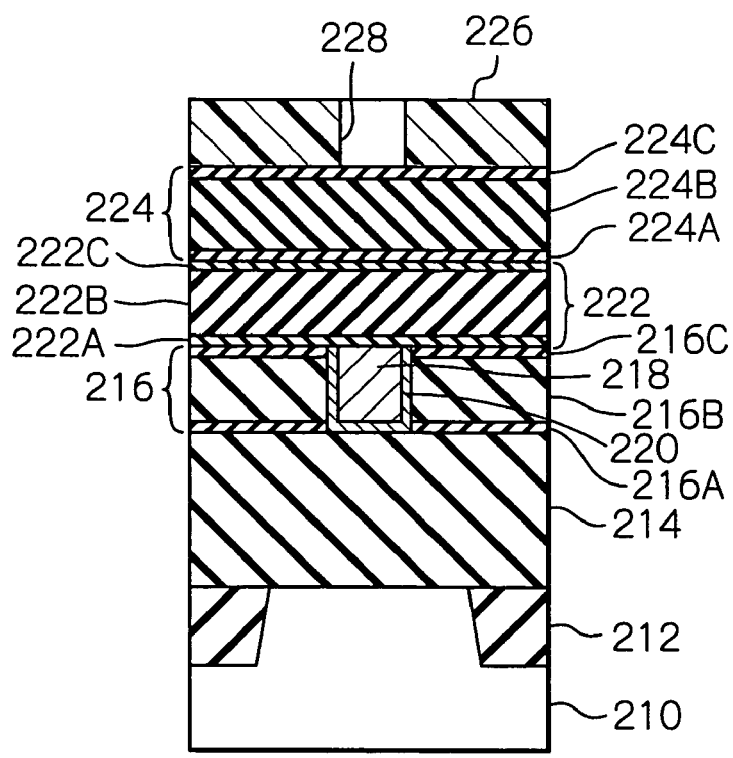
FIG. 8C is a partial cross-sectional view, similar to FIG. 8B, showing a third representative step of the second embodiment of the production process according to the present invention.

After the second and third insulating interlayer structures 222 and 224, as shown. in FIG. 8C, a photoresist layer 226 is formed on the third insulating interlayer structure 224, and is patterned and produced as a photo mask layer by using a photolithography process and an etching process. Namely, the patterned photoresist layer or photo mask layer 32 has respective plural sets of holes formed therein above the semiconductor chip areas on the silicon wafer. A part of the holes in each set corresponds to via plugs to be formed in the second insulating interlayer structure 222 and to be connected to a corresponding wiring layout pattern formed in the first insulating interlayer structure 216, and the remaining part of the holes corresponds to joint plugs to be formed in the second insulating interlayer structure 222 and to be connected to the reinforcing elements (218) of the reinforcing pattern. Note, in FIG. 8C, a hole, corresponding to one of the joint plugs to be connected to the reinforcing element 218, is indicated by reference 228.

Figure 8D:
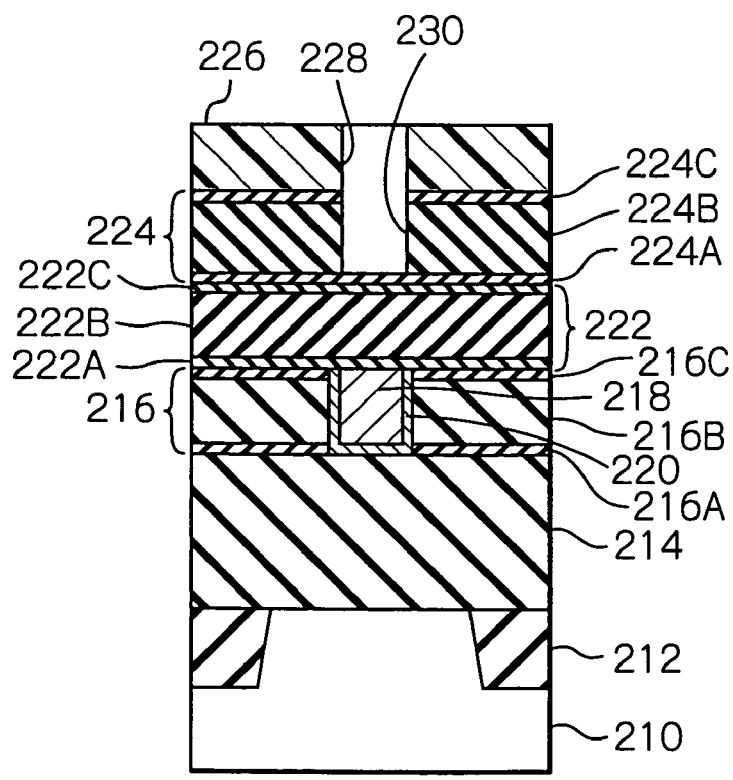
FIG. 8D is a partial cross-sectional view, similar to FIG. 8C, showing a fourth representative step of the second embodiment of the production process according to the present invention.
Figure 8E:
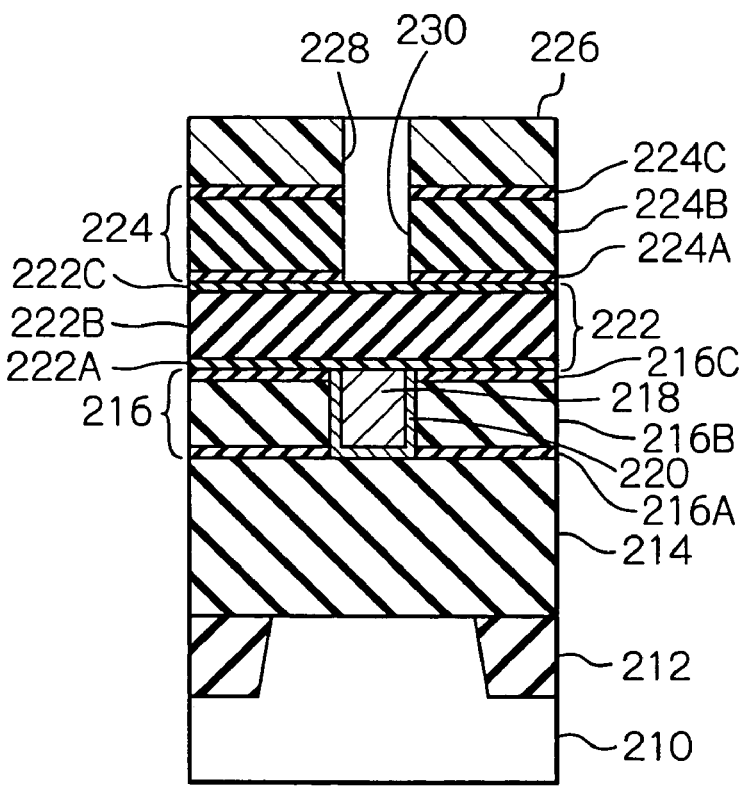
FIG. 8E is a partial cross-sectional view, similar to FIG. 8D, showing a fifth representative step of the second embodiment of the production process according to the present invention.

After the formation of the patterned photoresist layer or photo mask layer 226, the third insulating interlayer structure 224 is subjected to an anisotropic etching process or dry etching process at a low energy level, in which respective plural sets of holes, corresponding to the plural sets of the holes of the photo mask layer 226, are formed in both the thin protective layer 224C and the low-k insulating layer 224B, as representatively shown in FIG. 8D. Note, in FIG. 8D, a hole, corresponding to the hole 228 (FIG. 8C), is indicated by reference 230. Then, the third insulating interlayer structure 224 is further subjected to an anisotropic etching process or dry etching process at a high energy level, and the etching stopper layer 224A is removed from the bottoms of the holes (230), as representatively shown in FIG. 8E.

Figure 8F:
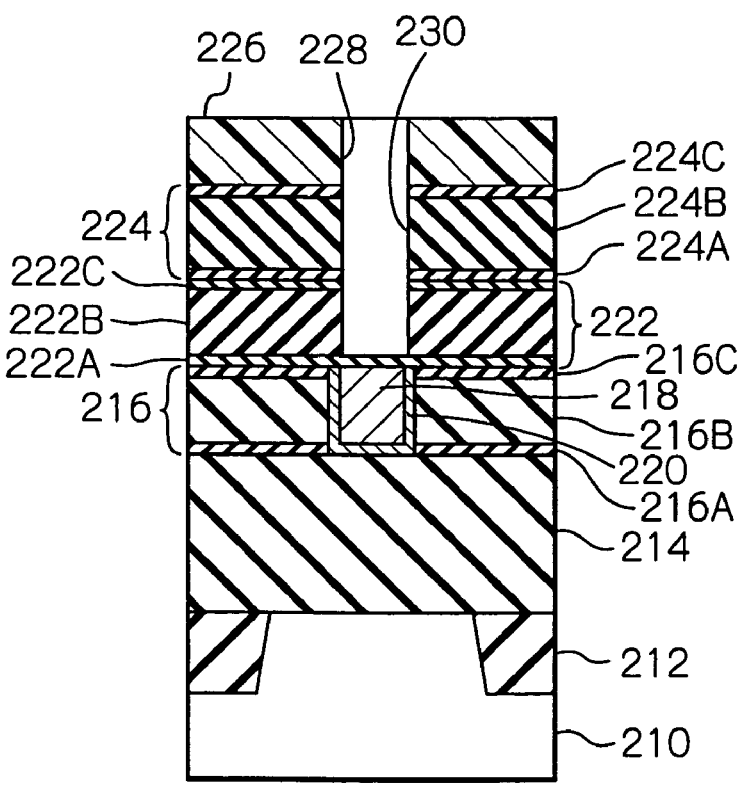
FIG. 8F is a partial cross-sectional view, similar to FIG. 8E, showing a sixth representative step of the second embodiment of the production process according to the present invention.
Figure 8G:
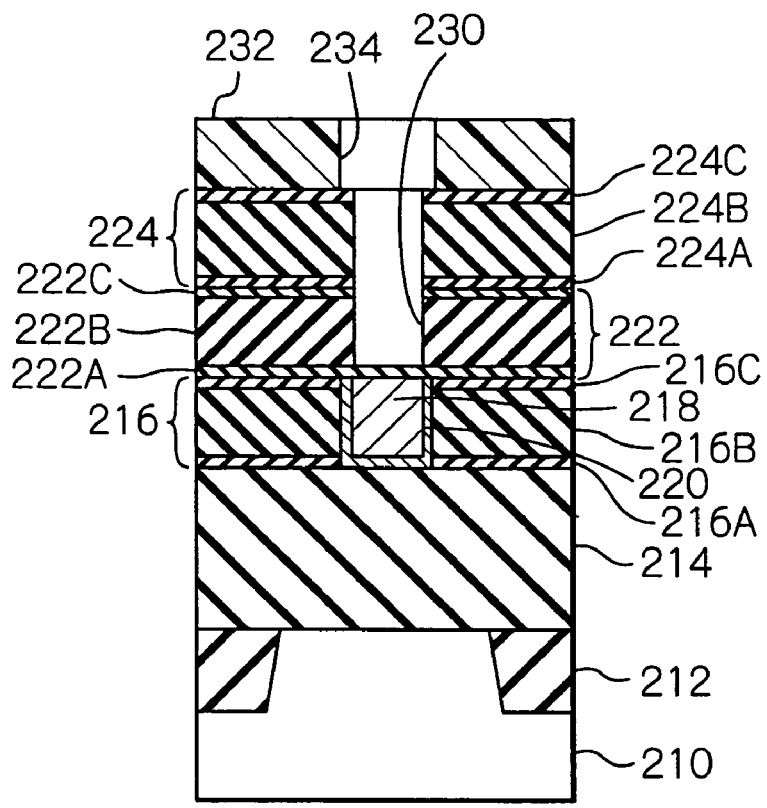
FIG. 8G is a partial cross-sectional view, similar to FIG. 8F, showing a seventh representative step of the second embodiment of the production process according to the present invention.

Subsequently, the second insulating interlayer structure 222 is subjected to an anisotropic etching process or dry etching process at a low energy level, in which the holes (230) are further deeply penetrated into the second insulating interlayer structure 222 so as to be extended to the etching stopper layer 222A, as shown in FIG. 8F.

Thereafter, the photo mask layer 226 is removed from the third insulating interlayer structure 224. Then, as 20 shown in FIG. 8G, a photoresist layer 232 is formed on the third insulating interlayer structure 224, and is patterned and produced as a photo mask layer by using a photolithography process and an etching process. Namely, the patterned photoresist layer or photo mask layer 232 has respective plural sets of openings formed therein above the semiconductor chip areas on the silicon wafer. A part of the openings in each set corresponds to a wiring layout pattern to be formed in the third insulating interlayer structure 224 above a corresponding semiconductor chip area on the silicon wafer, and the remaining part of the openings corresponds to a reinforcing pattern to be formed in the third insulating interlayer structure 224 above that semiconductor chip area. Note, the reinforcing pattern includes a plurality of reinforcing elements, in FIG. 8G, the opening, corresponding to one of the reinforcing elements, is indicated by reference 234.

Figure 8H:
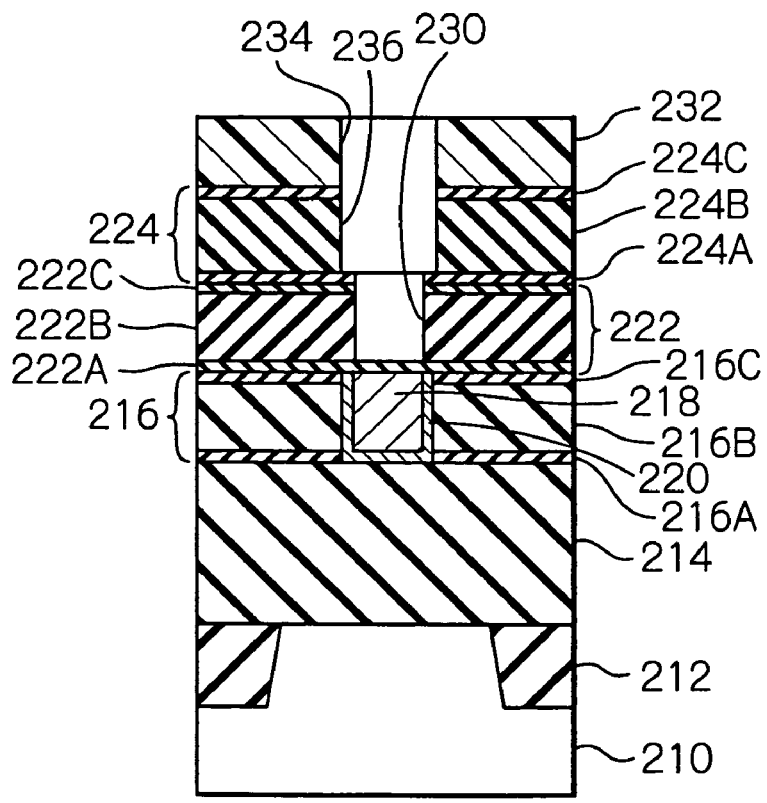
FIG. 8H is a partial cross-sectional view, similar to FIG. 8G, showing an eighth representative step of the second embodiment of the production process according to the present invention.

After the formation of the patterned photoresist layer or photo mask layer 232, the third insulating interlayer structure 224 is subjected to an anisotropic etching process or dry etching process at a low energy level, in which respective plural sets of trenches, corresponding to the plural sets of the openings of the photo mask layer 232, are formed in both the thin protective layer 224C and the low-k insulating layer 224B, as representatively shown in FIG. 8H. Note, in FIG. 8H, a trench, corresponding to the opening 234 (FIG. 8G), is indicated by reference 236.

Figure 8I:
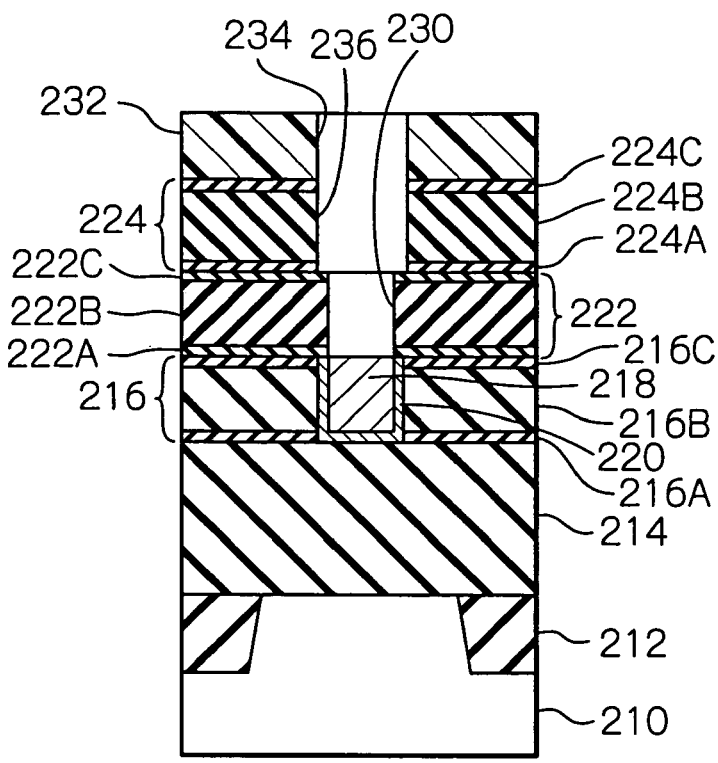
FIG. 8I is a partial cross-sectional view, similar to FIG. 8H, showing a ninth representative step of the second embodiment of the production process according to the present invention.

Then, the third insulating interlayer structure 224 is further subjected to an anisotropic etching process or dry etching process at a high energy level, the etching stopper layer 224A is removed from the bottoms of the trenches (236), and the etching stopper layer 222A is removed from the bottoms of the holes (230), as representatively shown in FIG. 8I.

Figure 8J:
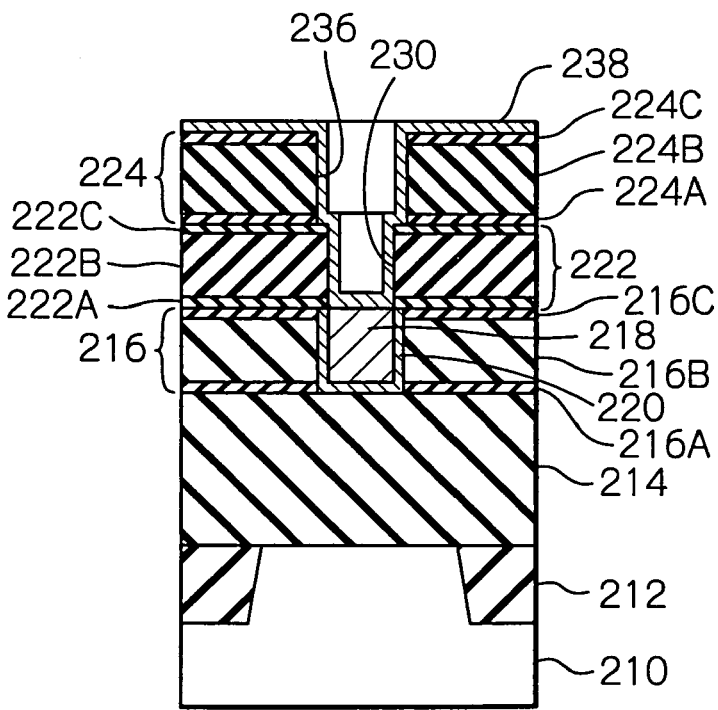
FIG. 8J is a partial cross-sectional view, similar to FIG. 8I, showing a tenth representative step of the second embodiment of the production process according to the present invention.

Thereafter, the photo mask layer 232 is removed from the third insulating interlayer structure 224, and then both the patterned insulating interlayer structures 222 and 224 are subjected to a sputtering process in which a barrier metal layer 238 is formed on the third insulating interlayer structure 224, as representatively shown in FIG. 8J, with side wall faces and bottom wall faces of the holes (230) and trenches (236) being covered with the barrier metal layer 238. Note, similar to the barrier metal layer 24, the barrier metal layer 238 may be composed of any one of the aforesaid various metal materials and metal compound materials.

Figure 8K:
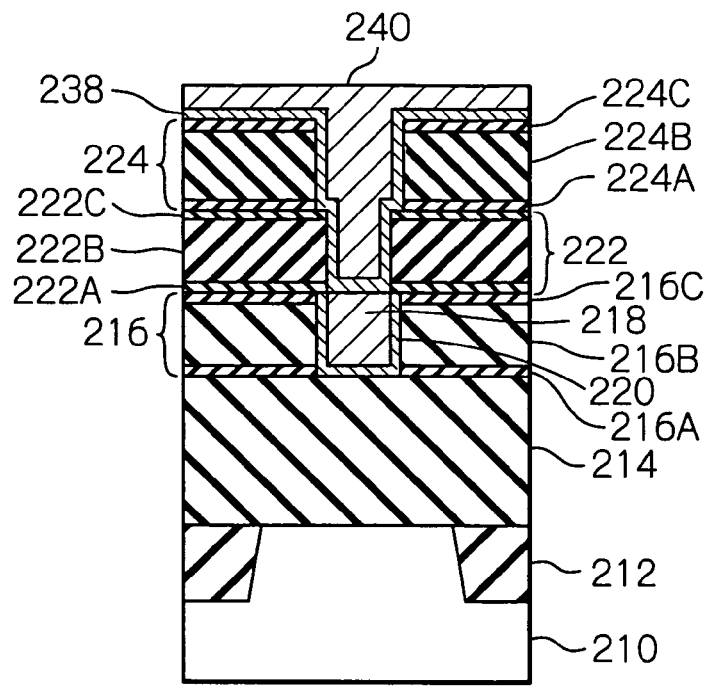
FIG. 8K is a partial cross-sectional view, similar to FIG. 8J, showing an eleventh representative step of the second embodiment of the production process according to the present invention.

After the formation of the barrier metal layer 238 is completed, a copper (Cu) layer 240 is formed on the barrier metal layer 238 such that all the holes (230) and trenches (236) are filled with copper (Cu), as representatively shown in FIG. 8K. In particular, first, a copper (Cu) seed layer is formed on the barrier metal layer 238, using a sputtering process, and then the formation of the Cu layer 240 is carried out, using an electroplating process in which the Cu seed layer serves as a cathode electrode. Then, the Cu layer 240 is subjected to an annealing process for crystallization.

Figure 8L:
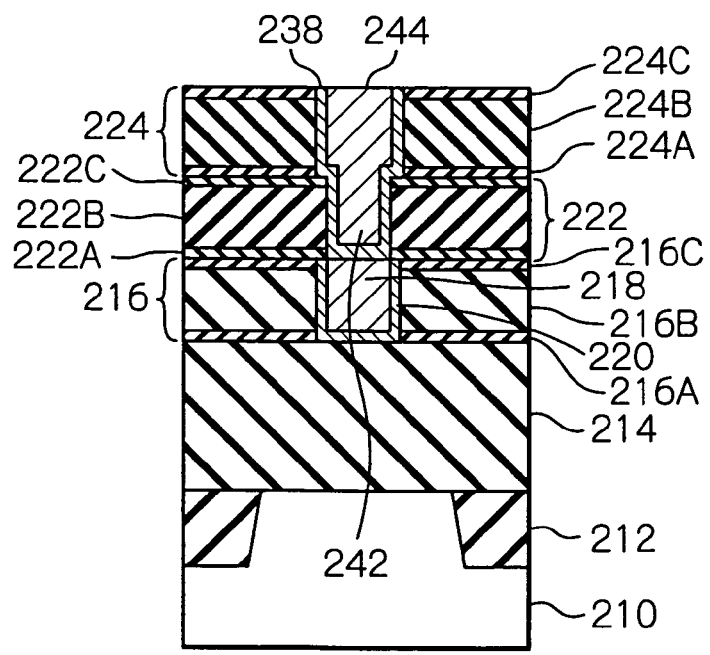
FIG. 8L is a partial cross-sectional view, similar to FIG. 8K, showing a twelfth representative step of the second embodiment of the production process according to the present invention.

After the annealing process is completed, the silicon wafer is set in a chemical mechanical polishing (CMP) apparatus, and both the Cu layer 240 and the barrier metal layer 238 are chemically and mechanically polished so that the redundant metals (Cu and e.g. Ti) are removed therefrom, resulting in formation of a copper wiring layout pattern with copper via plugs and a copper reinforcing patterns with copper joint plugs in both the second and third insulating interlayer structures 222 and 224 above each of the semiconductor areas on the silicon wafer, as representatively shown in FIG. 8L. Note, in FIG. 8L, one of the joint plugs is indicated by reference 242, and one of the reinforcing elements is indicated by reference 244.

In the above-mentioned embodiments, although the reinforcing elements and the joint plugs are made of copper (Cu), another metal material, such as tungsten (W) or the like, may be used for the reinforcing elements. Also, it is unnecessary to make the reinforcing elements and the joint plugs of the same metal material. For example, when the reinforcing elements are made of copper, it is possible to make the joint plugs of tungsten.

Finally, it will be understood by those skilled in the art that the foregoing description is of preferred embodiments of the methods and devices, and that various changes and modifications may be made to the present invention without departing from the spirit and scope thereof.

The invention claimed is:

1. A semiconductor device comprising:
    a semiconductor substrate having electronic elements produced therein;
    an insulating underlayer formed on said semiconductor substrate; and
    a multi-layered wiring arrangement constructed on said insulating underlayer,
    wherein said multi-layered wiring arrangement includes at least three insulating interlayer structures formed on said insulating underlayer; each insulating interlayer structure including a low-k insulating layer, each insulating interlayer structures having at least one reinforcing element or joint plug formed therein, such that reinforcing elements and joint plugs are alternately arranged in adjacent insulating interlayer structures such that each reinforcing element is connected to another reinforcing element through a corresponding joint plug to bind said insulating interlayer structures together.

2. The semiconductor device as set forth in claim 1, wherein said reinforcing elements and said joint plug define a reinforcing column extending through said at least three insulating interlayer structures.

3. The semiconductor device as set forth in claim 2, wherein a plurality of reinforcing columns are defined in said multi-layered wiring arrangement so as to extend through said at least three insulating interlayer structures.

4. The semiconductor device as set forth in claim 3, wherein said multi-layered wiring arrangement further includes an uppermost insulating interlayer structure having a plurality of electrode pads formed therein, and said reinforcing columns are arranged around each of said electrode pads in said multi-layered wiring arrangement.

5. The semiconductor device as set forth in claim 4, wherein the reinforcing elements, included in two adjacent reinforcing columns, are integrated with each other to thereby produce a beam-like reinforcing element.

6. The semiconductor device as set forth in claim 3, wherein said reinforcing columns are entirely and uniformly distributed in said multi-layered wiring arrangement.

7. The semiconductor device as set forth in claim 3, wherein said reinforcing columns are closely arranged along sides of said multi-layered wring arrangement.

8. The semiconductor device as set forth in claim 3, wherein said reinforcing columns are closely arranged at corner areas of said multi-layered wring arrangement.

9. The semiconductor device as set forth in claim 1, wherein said multi-layered wiring arrangement further includes at least one oxide insulating interlayer structure having an oxide insulating layer formed therein, and said at least one oxide insulating interlayer structure is provided above said at least three insulating interlayer structures.

10. The semiconductor device as set forth in claim 9, wherein said at least one oxide insulating interlayer structure has a wiring layout pattern formed therein, and a part of said wiring layout pattern is positioned above a reinforcing column defined by alternately connecting the reinforcing elements and the joint plug.

11. The semiconductor device as set forth in claim 1, wherein said insulating underlayer has a joint plug formed therein, one end of said joint plug being connected to said substrate semiconductor substrate, the other end of said joint plug being connected to the reinforcing element formed in a first insulating interlayer structure formed on said insulating underlayer.

12. The semiconductor device as set forth in claim 1, wherein at least one reinforcing element comprises an elongated reinforcing element, the joint plug formed in an adjacent insulating interlayer structure being connected to one end of said elongated reinforcing element, the joint plug formed in another adjacent insulating interlayer structure being connected to the other end of said elongated reinforcing element.

13. The semiconductor device as set forth in claim 1, wherein each of the reinforcing elements formed in corresponding insulating interlayer structures is formed as a frame-like reinforcing element extending along sides of said multi-layered wiring arrangement, and the joint plug formed in corresponding insulating interlayer structures is formed as a frame-like joint plug extending along the sides of said multi-layered wiring arrangement, said frame-like reinforcing elements being thicker than said frame-like joint plug, said frame-like reinforcing elements and said frame-like joint plug define a reinforcing wall extending through said insulating interlayer structures.

14. The semiconductor device as set forth in claim 13, wherein said insulating underlayer has a frame-like joint plug formed therein, and said frame-like joint plug has substantially the same contour as the frame-like joint formed in a first joint plug containing insulating interlayer structure disposed above a first reinforcing element containing insulating structure, and is connected to said semiconductor substrate and said frame-like reinforcing element formed in said first reinforcing element containing insulating interlayer structure.

15. A production method for manufacturing a semiconductor device comprising:
preparing a semiconductor substrate having an electronic element produced therein;
forming an insulating underlayer on said semiconductor substrate;
forming a first insulating interlayer structure on said insulating underlayer, said first insulating interlayer structure including a low-k insulating layer;
forming a reinforcing element in the low-k insulating layer of said first insulating interlayer structure while forming a wiring layout pattern therein;
forming a second insulating interlayer structure on said first insulating interlayer structure, said second insulating interlayer structure including a low-k insulating layer;
forming a joint plug in the low-k insulating layer of said second insulating interlayer structure while forming a via plug therein, said joint plug being connected to the reinforcing element formed in said first insulating interlayer structure;
forming a third insulating interlayer structure on said second insulating interlayer structure, said third insulating interlayer structure including a low-k insulating layer; and
forming a reinforcing element in the low-k insulating layer of said third insulating interlayer structure while forming a wiring layout pattern therein, said reinforcing element formed in said third insulating interlayer structure being connected to the joint plug formed in said second insulating interlayer structure.

16. The production method as set forth in claim 15, further comprising forming a joint plug in said insulating underlayer while forming a contact plug therein to electrically connect said electronic element to the wiring layout pattern formed in said first insulating interlayer structure, the joint plug formed in said insulating interlayer being connected to said semiconductor substrate and the reinforcing element formed in said first insulating interlayer structure.

17. A production method for manufacturing a semiconductor device comprising:
preparing a semiconductor substrate having an electronic element produced therein;
forming an insulating underlayer formed on said semiconductor substrate;
forming a first insulating interlayer structure on said insulating underlayer, said first insulating interlayer structure including a low-k insulating layer;
forming a reinforcing element in the low-k insulating layer of said first insulating interlayer structure while forming a wiring layout pattern therein;
forming a second insulating interlayer structure and a third insulating interlayer structure in order on said first insulating interlayer structure, each of said second and third insulating interlayer structures including a low-k insulating layer; and forming both a joint plug and a reinforcing element in the respective low-k layers of said second and third insulating interlayer structures while forming both a via plug and a wiring layout pattern therein, said joint plug being connected to the reinforcing element formed in said first insulating interlayer structure.

* * * * *